(12) United States Patent
Koo et al.

(10) Patent No.: US 12,028,975 B2
(45) Date of Patent: Jul. 2, 2024

(54) ELECTRONIC DEVICE INCLUDING SHIELDING MEMBER

(71) Applicant: Samsung Electronics Co., Ltd., Suwon-si (KR)

(72) Inventors: Younggwon Koo, Suwon-si (KR); Juhee Kim, Suwon-si (KR); Jangsun Yoo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 303 days.

(21) Appl. No.: 17/521,465

(22) Filed: Nov. 8, 2021

(65) Prior Publication Data

US 2022/0151067 A1 May 12, 2022

Related U.S. Application Data

(63) Continuation of application No. PCT/KR2021/015672, filed on Nov. 2, 2021.

(30) Foreign Application Priority Data

Nov. 9, 2020 (KR) ........................ 10-2020-0148349

(51) Int. Cl.
*H05K 1/18* (2006.01)
*H05K 1/11* (2006.01)
*H05K 9/00* (2006.01)

(52) U.S. Cl.
CPC ........... *H05K 1/112* (2013.01); *H05K 9/0015* (2013.01); *H05K 9/0024* (2013.01)

(58) Field of Classification Search
CPC ..... H05K 1/112; H05K 9/0015; H05K 9/0024
(Continued)

(56) References Cited

U.S. PATENT DOCUMENTS

| 5,231,561 A | 7/1993 | Johnson et al. |
| 6,729,905 B1 | 5/2004 | Hwang |

(Continued)

FOREIGN PATENT DOCUMENTS

| JP | 2006-173609 A | 6/2006 |
| JP | 2010-251375 A | 11/2010 |

(Continued)

OTHER PUBLICATIONS

International Search Report and Written Opinion of the International Searching Authority dated Feb. 9, 2022, in connection with International Application No. PCT/KR2021/015672, 11 pages.

*Primary Examiner* — Binh B Tran

(57) ABSTRACT

According to various embodiments of the disclosure, an electronic device may comprise a housing at least partially including an electrically conductive material, a first circuit board disposed in the housing, a connection member disposed on the first circuit board and partially extending past an edge of the first circuit board, a second circuit board disposed in the housing and connected to the connection member from a side of the first circuit board in which the connection member extends, and a shielding member disposed to surround the connection member and the second circuit board inside the housing. The shielding member may be electrically connected to at least one of the housing and the first circuit board. Other various embodiments are possible.

20 Claims, 13 Drawing Sheets

(58) Field of Classification Search
USPC .......................................................... 361/816
See application file for complete search history.

(56) References Cited

U.S. PATENT DOCUMENTS

| | | |
|---|---|---|
| 6,958,445 B1 | 10/2005 | Boudreaux et al. |
| 2007/0270000 A1 | 11/2007 | Cheng |
| 2010/0259905 A1* | 10/2010 | Tanno ................... H04B 15/02 |
| | | 361/748 |
| 2011/0226523 A1 | 9/2011 | Tamaki et al. |
| 2013/0016484 A1 | 1/2013 | Yoo |
| 2016/0037642 A1 | 2/2016 | Takai et al. |
| 2016/0242331 A1 | 8/2016 | Park et al. |
| 2017/0099735 A1* | 4/2017 | Takai ................... H05K 9/0058 |
| 2018/0310441 A1* | 10/2018 | Chang ................... H05K 1/0243 |
| 2019/0229473 A1 | 7/2019 | Lee et al. |
| 2021/0153373 A1* | 5/2021 | Chen ....................... H05K 7/02 |

FOREIGN PATENT DOCUMENTS

| | | |
|---|---|---|
| JP | 2011-198861 A | 10/2011 |
| JP | 2013-021671 A | 1/2013 |
| JP | 2016-039698 A | 3/2016 |
| JP | 2019-009214 A | 1/2019 |
| KR | 10-2011-0027985 A | 3/2011 |
| KR | 10-2016-0101592 A | 8/2016 |

* cited by examiner

ELECTRONIC DEVICE INCLUDING SHIELDING MEMBER

CROSS-REFERENCE TO RELATED APPLICATIONS

This application is a continuation application, claiming priority under § 365(c), of an International application No. PCT/KR2021/015672, filed on Nov. 2, 2021, which is based on and claims the benefit of a Korean patent application number 10-2020-0148349, filed on Nov. 9, 2020, in the Korean Intellectual Property Office, the disclosures of which is incorporated by reference herein in its entirety.

BACKGROUND

1. Field

Various embodiments of the disclosure relate to an electronic device, e.g., an electronic device with a shielding member.

2. Description of Related Art

The growth of electronics, information, and communication technologies leads to integration of various functions into a single electronic device. For example, smartphones pack the functionalities of a sound player, imaging device, and scheduler, as well as the communication functionality and, on top of that, may implement more various functions by having applications installed thereon. An electronic device may not only execute its equipped applications or stored files but also access, wiredly or wirelessly, a server or another electronic device to receive, in real-time, various pieces of information.

With increased degree of integration, electronic devices are able to perform various functions despite their reduced size. As the electronic device is highly integrated, a controlling component (e.g., a processor or communication module) or an electronic component (e.g., an antenna module) for wireless communication in the electronic device may become more compact or advanced. For example, various electronic components, advanced or integrated, may exert enhanced performance.

The above-described information may be provided as background for the purpose of helping understanding of the disclosure. No claim or determination is made as to whether any of the foregoing is applicable as prior art in relation to the disclosure.

SUMMARY

As the performance of the electronic device increases, more data and signals may be processed inside the electronic device and transmitted, and communication with an external electronic device or network may be performed. As demand for communication and/or signal processing or transmission increases, the electromagnetic wave environment inside the electronic device may worsen. For example, electromagnetic interference may occur between electronic components (e.g., a semiconductor chip where a processor or communication module is mounted, a storage device, such as solid state drive (SSD), or a component assembly, or connection structure between electronic components may be exposed to electromagnetic interference so that transmission rate may be reduced or transmission signals may be distorted. For example, such electromagnetic interference may deteriorate the operating performance or power efficiency of the electronic device. Although various types of shielding structures have been proposed to suppress or prevent electromagnetic interference inside the electronic device, it may be difficult to place a shielding structure inside the compact or slim electronic device.

To address the foregoing issues and/or drawbacks and provide advantageous described below, according to various embodiments of the disclosure, there may be provided an electronic device including a shielding member, which may suppress or prevent electromagnetic interference between internal electronic components.

According to various embodiments of the disclosure, there may be provided an electronic device that is slimmer and more compact although including a shielding member.

Without being limited to the foregoing issues, additional aspects according to various embodiments will be suggested below in conjunction with the detailed description and will be partially apparent or understood by the suggested embodiments.

According to various embodiments of the disclosure, an electronic device may comprise a housing at least partially including an electrically conductive material, a first circuit board disposed in the housing, a connection member disposed on the first circuit board and partially extending past an edge of the first circuit board, a second circuit board disposed in the housing and connected to the connection member from a side of the first circuit board in which the connection member extends, and a shielding member disposed to surround the connection member and the second circuit board inside the housing. The shielding member may be electrically connected to at least one of the housing and the first circuit board.

According to various embodiments of the disclosure, an electronic device may comprise a housing at least partially including an electrically conductive material, a first circuit board disposed in the housing, a connector mounted on the first circuit board and partially protruding from an edge of the first circuit board, a second circuit board including at least one memory chip disposed on at least one surface and connected to the first circuit board through the connector from one side of the first circuit board, and a shield member disposed to surround the connector and the second circuit board and electrically connect to at least one of the housing and the first circuit board to form an electromagnetic shielding structure. When viewed from a front surface of the housing, the second circuit board may be disposed on a side of the first circuit board.

According to various embodiments of the disclosure, when the electronic device is viewed along the thickness direction, a storage device, e.g., an SSD, and/or a component assembly may be disposed not to overlap the first circuit board (e.g., a major circuit board). For example, in disposing the first circuit board, the electronic component assembly including the second circuit board, and the connection member (e.g., an on-board connector) to connect the second circuit board and/or the electronic component assembly to the first circuit board, various embodiments of the disclosure may suppress an increase in the thickness of the electronic device, making the electronic device compact or slim. According to an embodiment, the shielding member may prevent interference with other surrounding electronic components by the electromagnetic waves generated by the electrical signal(s) transmitted between the first circuit board and the second circuit board. In another embodiment, the shielding member may shield or protect the first circuit board, the second circuit board, and/or the connection member from electromagnetic interference. For example, the electronic device may include the shielding member electromagnetically shielding the electronic component assembly or the connection member, securing a stable operating environment. Other various effects may be provided directly or indirectly in the disclosure.

Other aspect(s), advantage(s) and major configuration(s) of the disclosure will become apparent to one of ordinary skill in the art from the following detailed description of various embodiments with reference to the accompanying drawings.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The foregoing and other aspects, configuration(s), and/or advantage(s) of various embodiments of the disclosure will be more apparent from the following detailed description taken in conjunction with the accompanying drawings.

Throughout the drawings, like reference numerals may be assigned to like parts, components, and/or structures.

DETAILED DESCRIPTION

Figure 1:
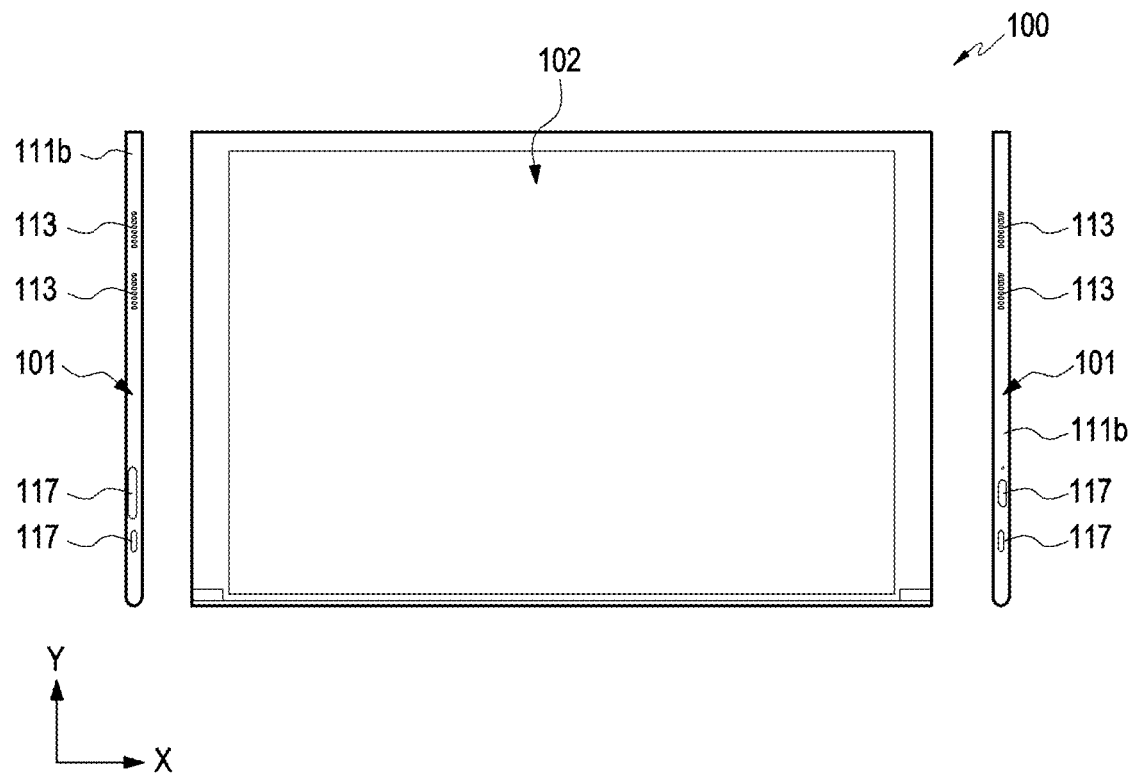
FIG. 1 is a three-side view illustrating an electronic device according to various embodiments of the disclosure.

FIGS. 1 through 19, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

The following description taken in conjunction with the accompanying drawings may be presented to provide a comprehensive understanding of various implementations of the disclosure as defined by the claims and equivalents thereto. The specific embodiments disclosed in the following description entail various specific details to aid understanding, but are regarded as one of various embodiments. Accordingly, it will be apparent to those skilled in the art that various changes and modifications may be made to the various implementations described in the disclosure without departing from the scope and spirit of the disclosure. Further, descriptions of well-known functions and configurations may be omitted for clarity and brevity.

The terms and words used in the following description and claims are not limited to the bibliographical meaning, but may be used to clearly and consistently describe the various embodiments of the disclosure. Therefore, it will be apparent to those skilled in the art that the following description of various implementations of the disclosure is provided only for the purpose of description, not for the purpose of limiting the disclosure defined as the scope of the claims and equivalent thereto.

The singular forms "a," "an," and "the" are intended to include the plural forms as well, unless the context clearly indicates otherwise. Thus, as an example, "a component surface" may be interpreted as including one or more of the surfaces of a component.

The electronic device according to various embodiments of the disclosure may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program) including one or more instructions that are stored in a storage medium (e.g., internal memory or external memory) that is readable by a machine (e.g., the electronic device). For example, a processor (e.g., the processor) of the machine (e.g., the electronic device) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
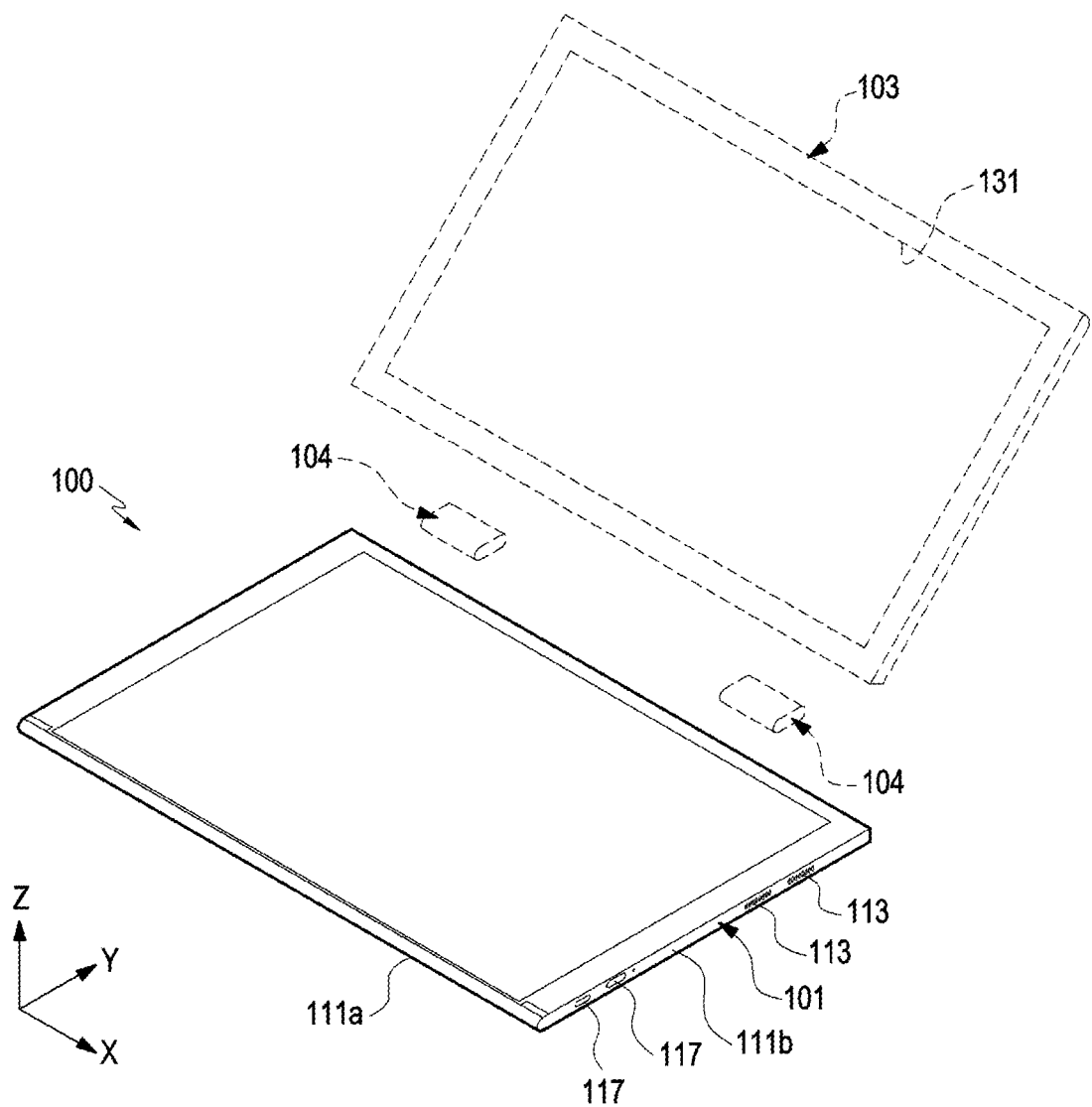
FIG. 2 is a perspective view illustrating the electronic device of FIG. 1.

FIG. 1 is a three-side view illustrating an electronic device 100 according to various embodiments of the disclosure. FIG. 2 is a perspective view illustrating the electronic device 100 of FIG. 1.

Referring to FIGS. 1 and 2, an electronic device 100 (e.g., the electronic device 200 of FIG. 3) according to an embodiment may include a housing 101 and a first plate 102 coupled to the housing 101 and disposed on a front surface of the electronic device 100. The first plate 102 may be referred to as, e.g., a display (e.g., the display 202 of FIG. 3), a window and/or a window plate (e.g., the window plate 221 of FIG. 3), and the first plate 102, together with the housing 101, may form the exterior of the electronic device 100. In another embodiment (not shown), the housing 101 is a structure that forms the inner space of the electronic device 100 and may be interpreted as a component including the first plate 102. According to an embodiment, the first plate 102 is a glass plate or a polymer plate, at least a portion of which is substantially transparent, and may include various coating layers. In one embodiment, a display panel (e.g., the display panel 223 of FIG. 3) may be disposed on the inner surface of the first plate 102. According to an embodiment, the first plate 102 alone and/or in combination with the display panel 223 may be referred to as a 'display'.

According to various embodiments, the rear surface of the electronic device 100 may be formed by a second plate 111a (e.g., the rear plate 211a of FIG. 3) provided as part of the housing 101. The second plate 111a may be formed of a substantially transparent material, e.g., laminated or colored glass, ceramic, polymer, metal (e.g., aluminum, stainless steel (STS), or magnesium), or a combination of at least two thereof. In one embodiment, the housing 101 may include a side structure 111b (or a "bezel structure)" that at least partially surrounds a space between the first plate 102 and the second plate 111a. For example, the first plate 102 may be coupled with the side structure 111b and may be disposed to face the second plate 111a while being spaced apart at a predetermined interval. In some embodiments, the side structure 111b may be provided as a separate component from the second plate 111a and may be coupled with the second plate 111a to form the housing 101 through a separate assembly process. In another embodiment, the second plate 111a and/or the side structure 111b may at least partially include an electrically conductive material, a metallic material, and/or a polymer material. When the second plate 111a and/or the side structure 111b may include an electrically conductive material, the housing 101 may at least partially function as an antenna for transmitting and receiving wireless signals and/or may function as a ground or electromagnetic shielding structure of the electronic device 100.

It should be noted that in the illustrated embodiment, the first plate 102 and/or the second plate 111a has a substantially flat plate shape but various embodiments of the disclosure are not limited thereto. For example, the first plate 102 and/or the second plate 111a may generally have a flat plate shape, but at least a portion of the edge thereof may have a curved shape. The side structure 111b connecting the edges of the first plate 102 and the second plate 111a may have a curved shape. In some embodiments, the thickness of the electronic device 100 in a central portion of the first plate 102, e.g., the thickness measured along the Z-axis direction, may be larger than the thickness measured at an edge of the first plate 102. For example, the thickness of the electronic device 100 may gradually decrease towards the edge on the front surface. When the first plate 102, the second plate 111a, and/or the side structure 111b have a curved shape in the exterior of the electronic device 100, the user may have a comfortable feel of grip.

According to an embodiment, the electronic device 100 may include a display (e.g., the display 202 of FIG. 3), an audio module 113, and/or a key input device 117 and may include at least one of a sensor module, a camera module, a light emitting device, and a connector hole which are not shown. According to an embodiment, the electronic device 100 may exclude at least one (e.g., the key input device 117 or the light emitting device) of the components or may add other components.

According to an embodiment, the display 202 may include, e.g., a display panel (e.g., the display panel 223 of FIG. 3) disposed inside the first plate 102 or the window plate 221 of FIG. 2 and may output visual information, such as text, images and/or videos, through a significant portion of the first plate 102 and/or the window plate 221. In some embodiments, substantially the entire area of the first plate 102 may be set as an area for outputting a screen. An area for outputting a screen may be formed to have substantially the same shape as an edge of the first plate 102. In another embodiment (not shown), as the distance between the area for outputting a screen and the outer edge of the first plate 102 is formed to be substantially the same, the ratio of the area for outputting a screen to the area provided by the first plate 102 may increase.

In another embodiment (not shown), a recess or opening may be formed in a portion of the screen display area of the display 202 and may include at least one or more of an audio module, a sensor module, a camera module, and a light emitting device aligned with the recess or opening. In another embodiment (not shown), the electronic device 100 may include at least one of an audio module, a sensor module, a camera module, a fingerprint sensor, and a light emitting device disposed to face in a direction opposite to the screen output direction of the display 202. In another embodiment (not shown), while facing in the same direction as the screen output direction, the electronic device may include at least one of an audio module, a sensor module, a camera module, and a light emitting device, disposed inside the screen display area of the display 202. For example, the camera module may not be visually exposed to the outside while overlapping the screen display area and may include a hidden under display camera (UDC).

According to another embodiment (not shown), the display 202 may be disposed to be coupled with, or adjacent, a touch detecting circuit, a pressure sensor capable of measuring the strength (pressure) of touches, and/or a digitizer for detecting a magnetic field-type stylus pen. In some embodiments, at least a portion of the sensor module and/or at least a portion of the key input device may be disposed inside the display.

In another embodiment (not shown), the display 202 may include a display (e.g., a flexible display) that is slidably disposed on the housing 101 to provide a screen (e.g., the screen display area). For example, the screen display area of the electronic device 100 is an area that is visually exposed and enables an image to be output. The electronic device 100 may decrease or increase the screen display area according to movement of a sliding plate (not shown) or movement of the display 202. For example, the electronic device 100 may include a rollable electronic device configured to selectively expand the screen display area as at least a portion (e.g., the housing) of the electronic device 100 is operated to be at least partially slidable. For example, the display 202 may be referred to as a slide-out display or an expandable display.

According to an embodiment, the audio module 113 may include a microphone hole and speaker holes. The microphone hole may have a microphone inside to obtain external sounds. According to an embodiment, there may be a plurality of microphones to be able to detect the direction of a sound. The speaker holes may include an external speaker hole and a phone receiver hole. According to an embodiment, the speaker hole and the microphone hole may be implemented as a single hole, or a speaker may be included without the speaker hole (e.g., a piezo speaker). In the illustrated embodiment, the audio module is exemplified as having the form of a hole penetrating the side, e.g., the side structure 111b (e.g., the side structure 211b of FIG. 3), of the electronic device but it should be noted that various embodiments of the disclosure are limited thereto. For example, when providing a voice call function, the electronic device 100 may further include an audio module (not shown) in the form of a hole penetrating the first plate 102. The number and positions of the audio modules 113 may be varied considering the shape, function, and/or actual use environment of the electronic device 100.

According to an embodiment, the sensor module may generate an electrical signal or data value corresponding to an internal operating state or external environmental state of the electronic device 100. The sensor module may include sensors for detecting the operating environment of the electronic device 100, such as a proximity sensor, an illuminance sensor, and a temperature/barometric pressure sensor, and may include sensors for obtaining the user's biometric information, such as a fingerprint sensor or a heart-rate monitor (HRM) sensor. Further, other various types of sensors, such as a gesture sensor, a gyro sensor, a magnetic sensor, an acceleration sensor, a grip sensor, a color sensor, an infrared (IR) sensor, or a humidity sensor, may be equipped in the electronic device 100. The arrangement of the sensor modules may be appropriately selected considering an actual use environment of the electronic device and the function provided in the electronic device.

According to an embodiment, a camera module (not shown) may be disposed on at least one of the front and rear surfaces of the electronic device 100. According to an embodiment, a plurality of camera modules may be arranged to face in the same direction. In some embodiments, the camera module may include a flash that provides illumination towards the subject. The camera module may include, e.g., one or more lenses, an image sensor, and/or an image signal processor. The flash may include, e.g., a light emitting diode (LED) or a xenon lamp.

According to an embodiment, the key input device 117 may be disposed on a side surface of the electronic device 100 and/or the housing 101. According to another embodiment, the electronic device 100 may exclude all or some of the above-mentioned key input devices 117 and the excluded key input devices 117 may be implemented in other forms, e.g., as soft keys, on the display. The number or positions of key input devices 117 are not limited to the illustrated embodiment, and an additional key input device may be installed on the front or rear surface of the electronic device and/or on a side surface (not shown) thereof. In another embodiment, part of the key input device 117 shown in FIG. 1 may be replaced with a slot or connector hole. For example, the electronic device 100 may receive a user identification module card or a memory card through a slot formed through the side structure and may transmit/receive power, sound signals and/or data to and from an external electronic device through the connector hole.

According to an embodiment, the light emitting device may be disposed on, e.g., the front surface of the housing 101. The light emitting device may provide, e.g., information about the state of the electronic device 100 in the form of light. In another embodiment, the light emitting device may provide, e.g., a light source that interworks with the operation of the camera module. The light emitting device may include, e.g., a light emitting device (LED), an infrared (IR) LED, or a xenon lamp.

According to various embodiments, the electronic device 100 may include a second housing 103 and at least one hinge module 104 rotatably coupling the second housing 103 to the housing 101. The second housing 103 may include, e.g., an input/output device 131, such as a display including the functionality of a touchscreen, and/or a keyboard. In one embodiment, the second housing 103 may pivot about the housing 101 from a position in which it is folded to face the housing 101 to a position in which it is unfolded by a designated angle (e.g., 180 degrees and/or 360 degrees). In some embodiments, the second housing 103 may be stopped in an inclined position with respect to the housing 101 in any position between the folded position and the designated angle. The second housing 103 may be similar to or substantially the same as the electronic device 100 or housing 101 described above and/or an electronic device (e.g., the electronic device 200 of FIG. 3) described below.

Figure 3:
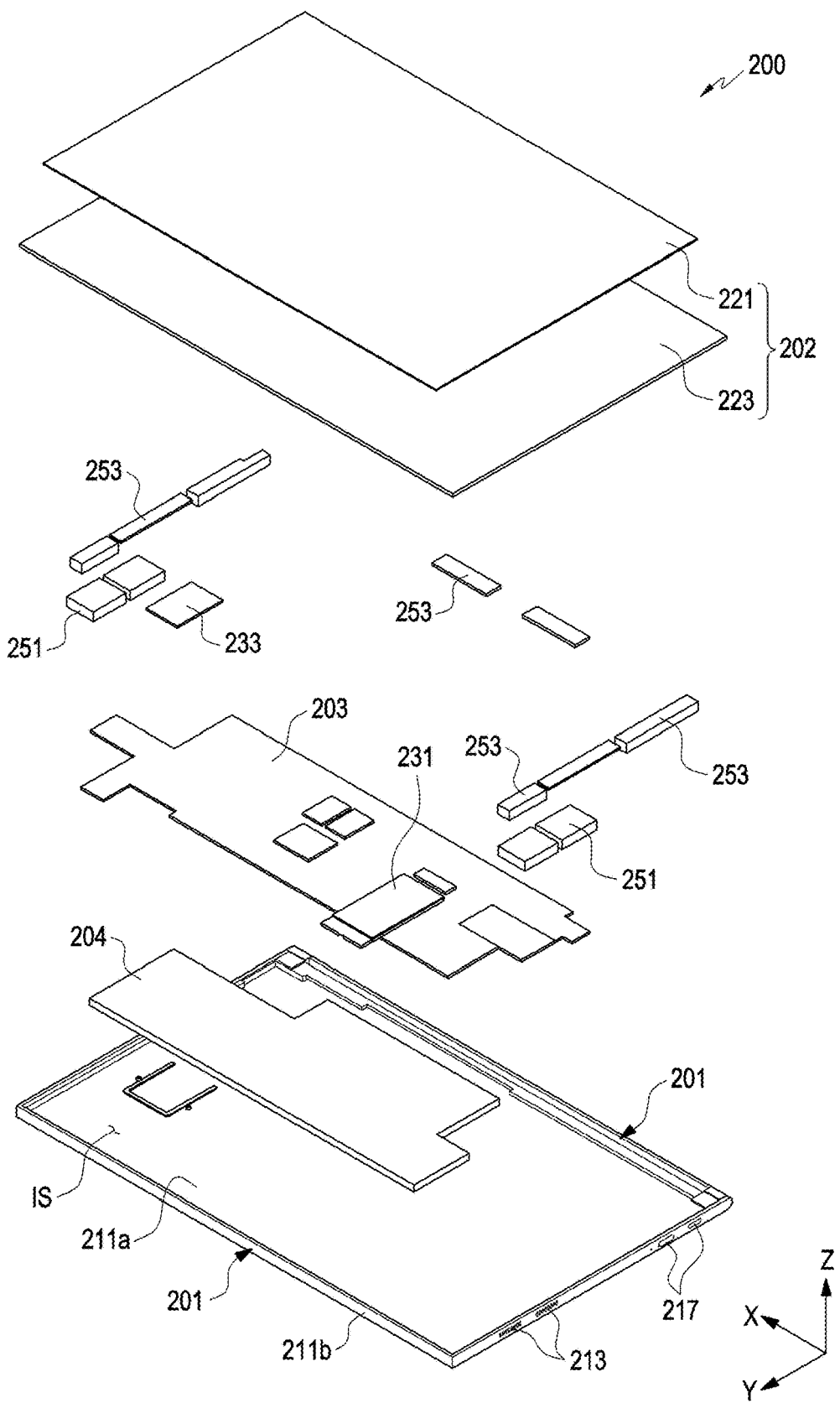
FIG. 3 is an exploded perspective view illustrating an electronic device according to various embodiments of the disclosure.

FIG. 3 is an exploded perspective view illustrating an electronic device 200 (e.g., the electronic device 100 of FIGS. 1 and/or 2) according to an embodiment.

Referring to FIG. 3, an electronic device 200 may include a housing 201 (e.g., the housing 101 of FIGS. 1 and/or 2), a display 202, a printed circuit board 203 (e.g., a printed circuit board (PCB), a printed board assembly (PBA), a flexible PCB (FPCB) or a rigid-flexible PCB (RFPCB)), a battery 204, and an antenna 253. In some embodiments, the electronic device 200 may omit at least one of the components or additionally include another component (e.g., a bracket for supporting or protecting the display 202). According to an embodiment (not shown), the electronic device 200 may include at least one hinge structure to thereby have a structure in which a housing split into a plurality of areas is folded. For example, according to a change in the state of the hinge structure (e.g., a folded state, an intermediate state, or an unfolded state), the state of the display operatively connected to the housing may change. For example, the first display corresponding to the first housing and the second display corresponding to the second housing may be changed to face each other or to be spaced apart from each other. According to an embodiment, at least one of the components of the electronic device 200 may be the same or similar to at least one of the components of the electronic device 100 of FIG. 1 or 2 and no duplicate description is made below.

According to an embodiment, the housing 201 may include a rear plate 211a (e.g., the second plate 111a of FIG. 1) and a side structure 211b (e.g., the side structure 111b of FIG. 1) extending from the rear plate 211a along the thickness direction (e.g., the Z-axis direction). In some embodiments, the side structure 211b may be formed as a separate component from the rear plate 211a and may be coupled with the rear plate 211a to form the housing 201. Although not shown, the housing 201 may further include a supporting member for isolating the display 202 (e.g., the display panel 223) from the space in which the printed circuit board 203 or the battery 204 is received, and the supporting member may have a flat plate shape which is integrally formed with the side structure 211b. In various embodiments described below, the rear plate 211a of FIG. 3 and the second plate 111a of FIG. 2 may be interpreted as being substantially the same.

According to various embodiments, the rear plate 211a and/or the side structure 211b may be formed of a metallic material and/or a non-metallic (e.g., polymer) material. For example, the housing 201 may at least partially include an electrically conductive material. In one embodiment, when the rear plate 211a includes an electrically conductive material, the housing 201 may be at least partially utilized as a structure that provides an electromagnetic shielding structure. In another embodiment, when the side structure 211b includes an electrically conductive material, at least a portion of the side structure 211b may be utilized as a radiating conductor for transmitting and receiving radio waves. In another embodiment, a supporting member may be disposed between the printed circuit board 203 and the display panel 223. When the supporting member includes an electrically conductive material, the supporting member may provide a ground conductor or electromagnetic shielding structure for the electronic device 200.

According to an embodiment, a processor, a memory, and/or an interface may be disposed on the printed circuit board 203 disposed as a first circuit board or a main circuit board. The processor may include one or more of, e.g., a central processing unit, an application processor, a graphic processing device, an image signal processing, a sensor hub processor, or a communication processor. In one embodiment, the processor or communication module may be mounted in the electronic component 231, such as an integrated circuit chip, and disposed on the printed circuit board 203. For example, the electronic component 231 may be disposed on the printed circuit board 203 through a surface mounting process and may perform wireless communication using the antenna 253 and/or a portion of the side structure 211b.

According to an embodiment, the memory may include, e.g., a volatile or non-volatile memory.

According to an embodiment, the interface may include, for example, a high-definition multimedia interface (HDMI), a universal serial bus (USB) interface, a secure digital (SD) card interface, and/or an audio interface. The interface may electrically or physically connect, e.g., the electronic device 200 with an external electronic device and may include a USB connector, an SD card/multimedia card (MMC) connector, or an audio connector.

According to an embodiment, the battery 204 may be a device for supplying power to at least one component of the electronic device 200. The battery 204 may include, e.g., a primary cell which is not rechargeable, a secondary cell which is rechargeable, or a fuel cell. At least a portion of the battery 204 may be disposed on substantially the same plane as the printed circuit board 203. The battery 204 may be integrally or detachably disposed inside the electronic device 200.

According to an embodiment, the antenna 253 may be disposed adjacent to an edge, e.g., the side structure 211b, inside the housing 201. In some embodiments, a plurality of antennas 253 may be arranged in suitable positions along the edge inside the housing 201. In one embodiment, the illustrated antenna 253 may perform millimeter wave (mmWave) communication using a frequency of several tens of GHz or more. In another embodiment, although not shown, the electronic device 200 may further include a flat antenna disposed between the rear plate 211a and the battery 204. The flat antenna may include a conductive line or printed circuit pattern disposed on a plane to form a loop structure, and it may function as, e.g., a near field communication (NFC) antenna, a wireless charging antenna, and/or a magnetic secure transmission (MST) antenna. For example, the flat antenna may perform short-range communication with, e.g., an external device or may wirelessly transmit or receive power necessary for charging.

According to various embodiments, the display 202 may include a window plate 221 (e.g., the first plate 102 of FIG. 1 or 2) and a display panel 223. The display panel 223 may be disposed on the inner surface of the window plate 221 and may output visual information using substantially the entire area of the window plate 221.

According to various embodiments, the electronic device 200 may include a plurality of through holes 213 and 217 formed through the side structure 211b. Among the plurality of through holes 213 and 217, a first through hole(s) 213 may be used as a path for outputting sound. For example, the audio module 113 of FIG. 1 or 2 may include the first through hole 213. In an embodiment, the electronic device 200 may include at least one speaker module 251 disposed in positions corresponding to the first through holes 213. The speaker module 251 may output sound to the outside of the electronic device 200 through the first through hole(s) 213. Among the plurality of through holes 213 and 217, a second through hole(s) 217 may provide a space for installing an input device, e.g., the key input device 117 of FIG. 1 or 2. In some embodiments, some of the plurality of through holes 213 and 217 may be utilized as a slot or connector hole for receiving a storage medium. According to an embodiment, an additional slot and/or connector hole may be formed through the side structure 211b.

According to various embodiments, the electronic device 200 may include a storage device 331 (e.g., memory), such as a hard disk drive (HDD) or a solid state drive (SSD). The storage device 331 may include, e.g., the second circuit board 331a of FIG. 5 and at least one memory chip 331b disposed on the second circuit board 331a and may be at least partially surrounded by the shielding member 335 of FIG. 6. For brevity of description, a component coupled with the storage device 331 and the shielding member 335 may be referred to as an 'electronic component assembly 233'. According to an embodiment, the storage device 331, e.g., the second circuit board 331a, may be electrically connected with the first circuit board, e.g., the printed circuit board 203 of FIG. 3, through the connection member 333 of FIG. 5.

According to various embodiments, in large-capacity data transfer or signal processing performed within the electronic device 200 and/or in the transmission/reception operation of a wireless signal through the antenna 253, electromagnetic interference may occur between the electronic component 231, the electronic component assembly 233, and/or the antenna 253. Such electromagnetic interference may be generated between various signal transmission lines or other electronic components not directly mentioned. In one embodiment, the shielding member 335 may be electrically connected with the housing 201 (e.g., the rear plate 211a) to form an electromagnetic shielding structure. For example, the storage device 331 (e.g., the second circuit board 331a and the memory chip 331b of FIG. 5) may be electromagnetically shielded by the shielding member 335 and/or the housing 201 and thus have a stable operating environment. In one embodiment, the electromagnetic shielding structure provided by the shielding member 335 and the housing 201 may be configured to receive at least the second circuit board 331a and the connection member 333.

The arrangement structure of the storage device 331 and/or the electronic component assembly 233 is described in more detail with reference to FIGS. 4 to 7.

Figure 4:
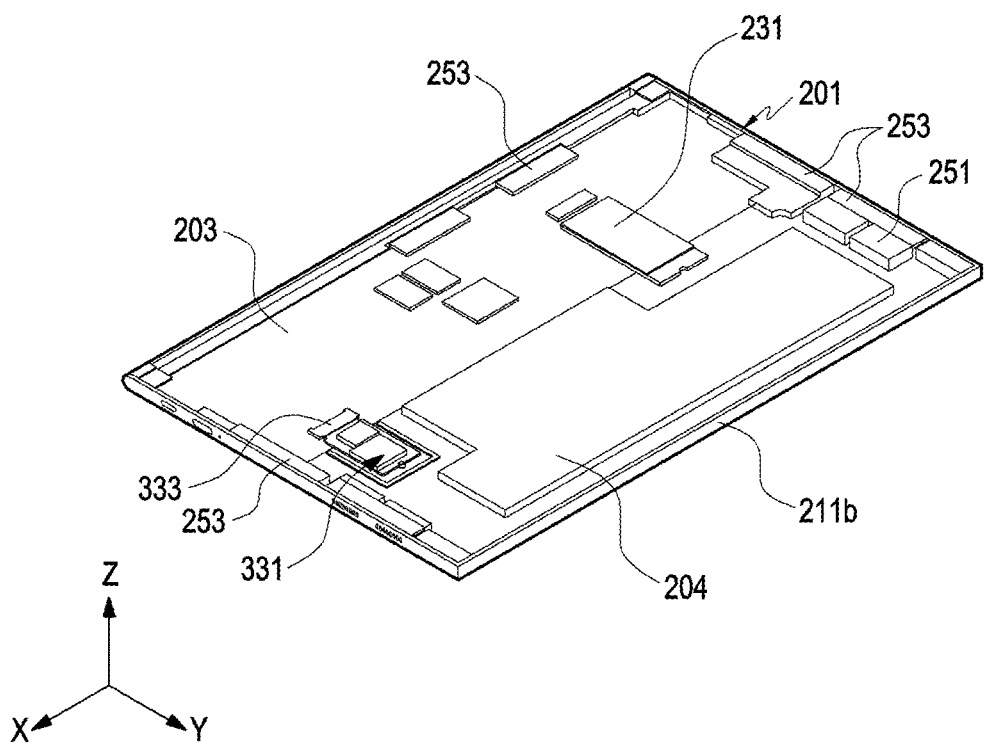
FIG. 4 is a perspective view illustrating an internal configuration of an electronic device according to various embodiments of the disclosure.
Figure 5:
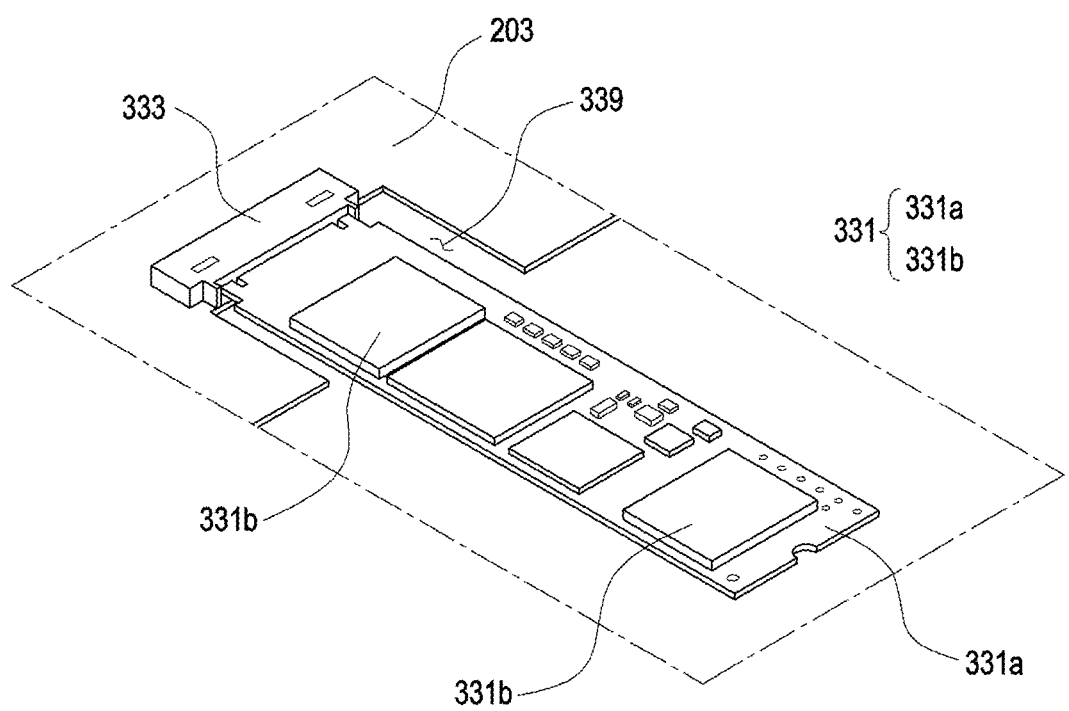
FIG. 5 is a perspective view illustrating a state in which a second circuit board of an electronic device is connected to a first circuit board according to various embodiments of the disclosure.

FIG. 4 is a perspective view illustrating an internal configuration of an electronic device (e.g., the electronic device 100 or 200 of FIGS. 1 to 3) according to various embodiments of the disclosure. FIG. 5 is a perspective view illustrating a state in which a second circuit board 331a of an electronic device 100 or 200 is connected to a first circuit board (e.g., the printed circuit board 203 of FIG. 3) according to various embodiments of the disclosure.

Referring to FIGS. 4 and 5, the printed circuit board 203 and the battery 204 inside the housing 201 may be disposed side by side in the length direction (e.g., the Y-axis direction), and the antenna 253 and/or the speaker module 251 may be disposed adjacent to the side structure 211b along an edge inside the housing 201. The electronic device 100 or 200 may include a plurality of antennas 253. Some of the plurality of antennas 253 may include a patch antenna and others may include a dipole antenna.

According to various embodiments, the electronic device 100 or 200 may include an opening area 339 provided on one side of the first circuit board, e.g., the printed circuit board 203. The opening area 339 may be defined substantially by the shape of the printed circuit board 203 and may mean an empty space or area extending from a portion of the edge of the printed circuit board 203 to the inside of the printed circuit board 203. In the illustrated embodiment, the opening area 339 is shaped to be open in one edge of the printed circuit board 203 but, in another embodiment, it may be shaped to be surrounded by the closed loop shaped portion of the printed circuit board 203 (e.g., the closed loop shaped portion of FIG. 16). For example, the opening area 339 may have a hole shape passing through the printed circuit board 203 along the Z-axis direction.

According to various embodiments, the connection member 333, as, e.g., a connector mounted on the printed circuit board 203, may provide a means to connect the storage device 331 (e.g., the second circuit board 331a) to the printed circuit board 203. In one embodiment, the connection member 333 may be mounted on one surface of the printed circuit board 203, and a portion thereof may protrude from an edge of the printed circuit board 203. Here, 'protrudes from an edge of the printed circuit board 203' may mean that in FIGS. 4 and/or 5, a portion of the connection member 333 is positioned in the +Y-axis direction beyond the edge of the printed circuit board 203. In the embodiment illustrated in FIG. 5, an on-board connector, e.g., the connection member 333, may be partially disposed on one surface of the printed circuit board 203 while a portion of the connection member 333 protrudes from the edge of the printed circuit board 203 and is disposed in the opening area 339. The placement of the connection member 333 is described below in greater detail with reference to FIG. 7.

According to various embodiments, the storage device 331 may be an SSD including a second circuit board 331a and at least one memory chip 331b mounted on the second circuit board 331a. In one embodiment, the second circuit board 331a may be fastened, to the connection member 333, on one side of the first circuit board (e.g., the printed circuit board 203) to be electrically connected with the printed circuit board 203. In some embodiments, the second circuit board 331a and/or the memory chip 331b may be connected to the connection member 333 while being at least partially received in the opening area 339. As described with reference to FIG. 13, in another embodiment, the opening area 339 may be utilized as an area that substantially receives a portion of the connection member 333, and the second circuit board 331a or the memory chip 331b may be disposed in a position off the opening area 339 and coupled to the connection member 333.

According to various embodiments, as the performance of the storage device 331 is advanced, data signal in a larger capacity may be transferred more quickly through the connection member 333, and an electromagnetic field may be produced while a data signal is transferred. In some embodiments, while a higher capacity of data signal is transferred more quickly, the data signal may be distorted or its speed may be reduced by the external electromagnetic field. The shielding member 335 and/or the housing 201 (e.g., the rear plate 211a) provides an electromagnetic shielding structure to the connection member 333, preventing an influence on another electronic component 231 by the electromagnetic field generated in the process of transferring the data signal or distortion of the data signal by the external electromagnetic field.

Figure 6:
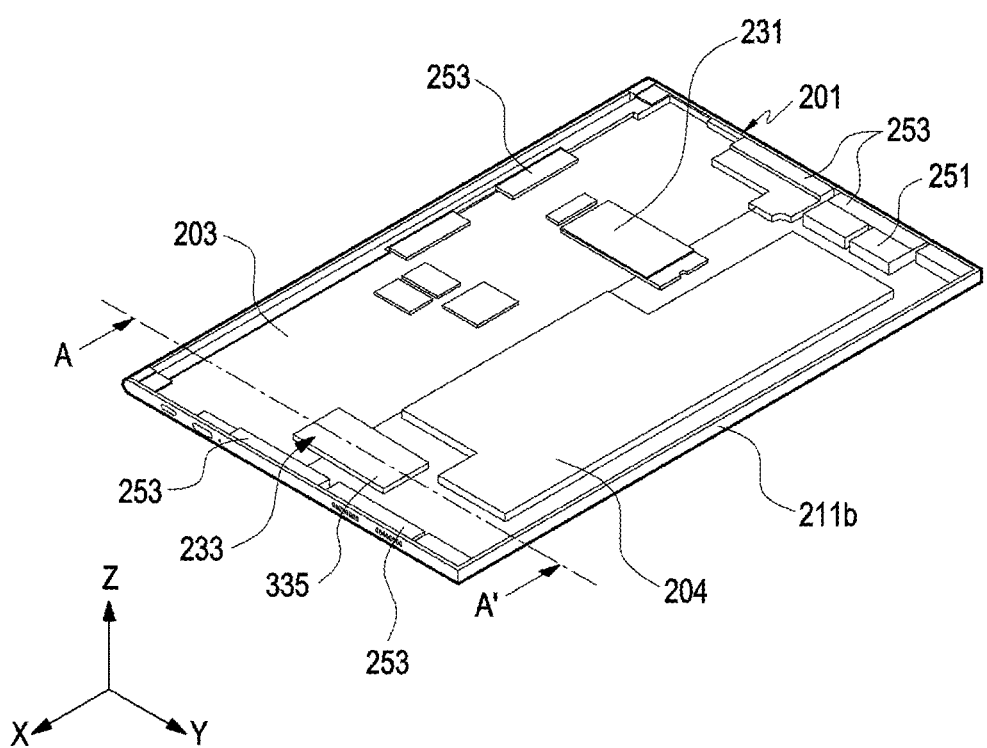
FIG. 6 is a perspective view illustrating an internal configuration of an electronic device, in which a shielding member is disposed, according to various embodiments of the disclosure.
Figure 7:
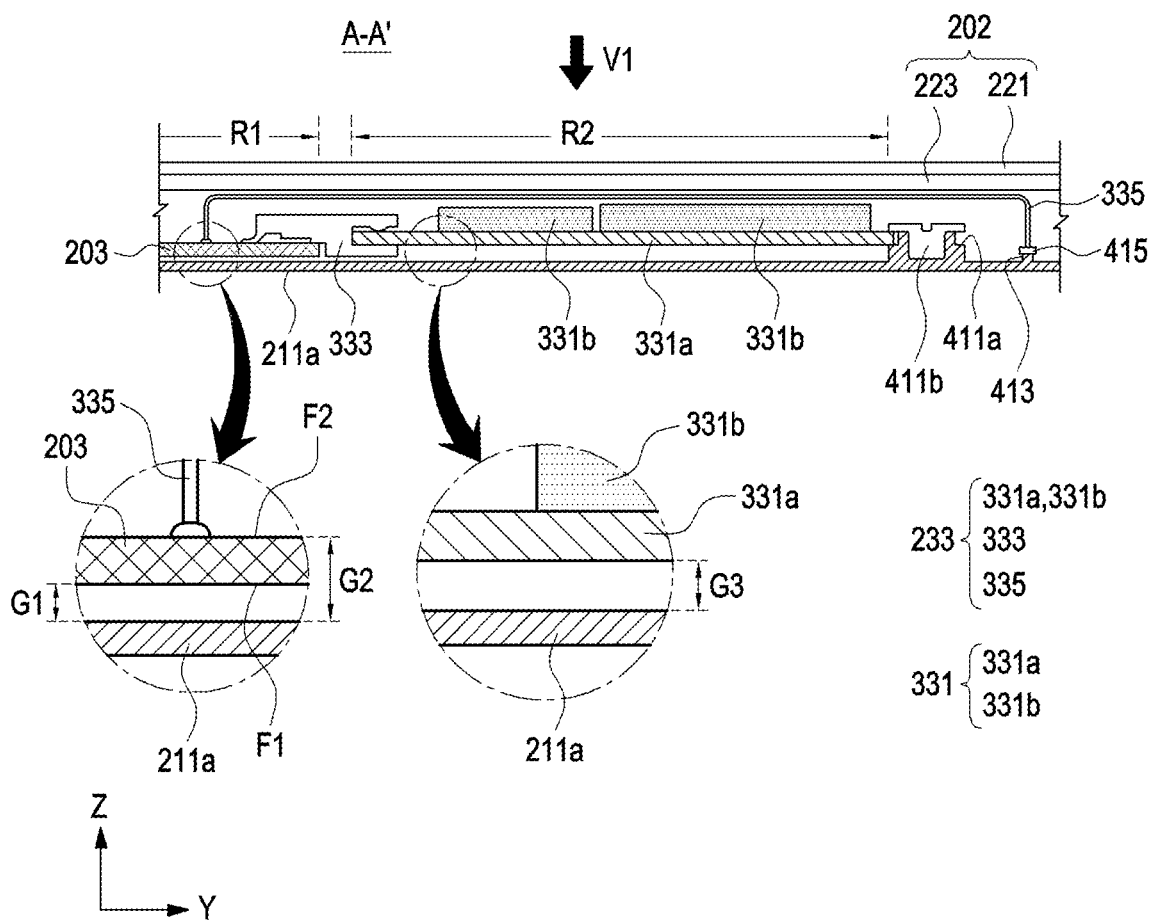
FIG. 7 is a cross-sectional view illustrating a portion of an electronic device, taken along line A-A' of FIG. 6.

FIG. 6 is a perspective view illustrating an internal configuration of an electronic device (e.g., the electronic device 100 or 200 of FIGS. 1 to 3), in which a shielding member 335 is disposed, according to various embodiments of the disclosure. FIG. 7 is a cross-sectional view illustrating a portion of the electronic device 100 or 200, taken along line A-A' of FIG. 6.

In the following detailed description, of two opposite surfaces of the printed circuit board 203 and the second circuit board 331a, the surface facing the inner surface IS of the housing 201 (e.g., the rear plate 211a) may be defined as a 'lower portion,' and the surface opposite to the lower surface may be defined as an 'upper surface'. This refers to the state illustrated in FIG. 7. According to an embodiment, the lower surface of the printed circuit board 203 or the second circuit board 331a may be referred to as a 'first surface (e.g., the first surface F1 of FIG. 7)', and the upper surface may be referred to as a 'second surface (e.g., the second surface F2 of FIG. 7)'.

Referring to FIGS. 6 and 7, the shielding member 335 may be disposed to receive the connection member 333 and the storage device 331 (e.g., the second circuit board 331a and/or the memory chip 331b) inside the housing 201 and may be electrically connected to the housing 201 and/or the printed circuit board 203. For example, the shielding member 335, along with the housing 201 and/or the printed circuit board 203, may form an electromagnetic shielding environment of the storage device 331 and the connection member 333 inside the electronic device 100 or 200. According to an embodiment, the shielding member 335 may include a shield can formed of stainless steel, e.g., a stainless using steel (SUS) material, and may be electrically connected with an electrically conductive material portion of the housing 201 and/or the printed circuit board 203 (e.g., a ground conductor inside the printed circuit board 203).

According to various embodiments, when viewed from the front surface of the housing 201, e.g., when viewed in the direction V1 of FIG. 7, the second circuit board 331a may be disposed not to overlap the first circuit board (e.g., the printed circuit board 203). For example, when viewed from the front surface of the housing 201, the second circuit board 331a may be disposed on one side of the printed circuit board 203. According to an embodiment, a portion of the connection member 333 may be mounted on one surface of the printed circuit board 203, and another portion thereof may be disposed in an opening area (e.g., the opening area 339 of FIG. 5). In some embodiments, the connection member 333 may have a thickness sufficient to receive the thickness of the printed circuit board 203 and, in the Z-axis direction, the printed circuit board 203 may be received or disposed within the range of the thickness of the connection member 333. For example, the electronic device 100 or 200 may provide a sufficient thickness or space to receive the connection member 333 and, given the thickness of the connection member 333 and the placement of the printed circuit board 203, the thickness of the printed circuit board 203 may not increase the thickness of the electronic device 100 or 200. In one embodiment, the connection member 333 at one edge of the second circuit board 331*a* may be coupled to surround the upper and lower surfaces of the second circuit board 331*a*. For example, the second circuit board 331*a* may be disposed within the thickness range of the connection member 333 in the Z-axis direction, so that the thickness of the second circuit board 331*a* may not increase the thickness of the electronic device 100 or 200.

According to various embodiments, when viewed from the front surface of the housing 201, the connection member 333 may be partially disposed between the first circuit board (e.g., the printed circuit board 203) and the second circuit board 331*a*. For example, if an area corresponding to the printed circuit board 203 may be defined as a 'first area R1' and an area corresponding to the second circuit board 331*a* is defined as a 'second area R2', when viewed from the front surface of the housing 201, the connection member 333 may be partially disposed between the first area R1 and the second area R2. In some embodiments, at least a portion of the housing 201 corresponding to the second area R2 may be formed of an electrically conductive material and be electrically connected with the shielding member 335 to form an electromagnetic shielding structure.

According to various embodiments, in a state of being fastened to the connection member 333, the second circuit board 331*a* may be disposed with a designated distance G3 formed between the lower surface and the housing 201 (e.g., the rear plate 211*a*). In one embodiment, the designated distance G3 may be larger than the gap G1 between the lower surface (e.g., the first surface F1) of the printed circuit board 203 and the inner surface IS of the housing 201 (e.g., the rear plate 211*a*) and smaller than the gap G2 between the upper surface (e.g., the second surface F2) of the printed circuit board 203 and the inner surface IS of the housing 201. For example, when viewed in the X-axis direction or the Y-axis direction of FIG. 6, the second circuit board 331*a* may at least partially overlap the printed circuit board 203. Accordingly, it is possible to prevent or alleviate an increase in the thickness of the electronic device 100 or 200 due to the thickness of the printed circuit board 203 and/or the second circuit board 331*a*.

According to various embodiments, the shielding member 335 may be electrically connected to at least one of the housing 201 and the first circuit board (e.g., the printed circuit board 203). For example, the shielding member 335 may be electrically connected to the ground conductor of the printed circuit board 203 and/or the electrically conductive portion of the housing 201 while receiving the connection member 333 and the storage device 331, forming an electromagnetic shielding structure. For example, the storage device 331 and the connection member 333 may transfer data signals or perform read/write operations without being affected by the electromagnetic field generated therearound. In another embodiment, even when the storage device 331 and the connection member 333 generate an electromagnetic field while transferring a data signal or performing a read/write operation, other electronic components (e.g., the electronic component 231 equipped with a processor or communication module) may not be affected.

According to various embodiments, the electronic device 100 or 200 may further include a shielding rib 413 protruding from the inner surface IS of the housing 201 and a gasket 415 having electrical conductivity. The shielding rib 413 may be formed to surround at least a portion of the periphery of the area (e.g., the second area R2) in which the second circuit board 331*a* is disposed. The shielding member 335 may be disposed to contact the upper end of the shielding rib 413 and may thus be electrically connected with the housing 201. According to an embodiment, the gasket 415 may be disposed on the upper end of the shielding rib 413 and may stably maintain an electrical connection state between the shielding member 335 and the shielding rib 413. For example, if the shielding member 335 is assembled on the housing 201, the gasket 415 is compressed to a certain extent between the shielding member 335 and the shielding rib 413 to form an electrical connection structure. As such, the shielding member 335 may be disposed in contact with the gasket 415 without directly contacting the inner surface IS of the housing 201 and/or the shielding rib 413 and may be electrically connected with the housing 201. In the illustrated embodiment, a configuration in which the shielding rib 413 is formed around the second area R2 is exemplified, but various embodiments of the disclosure are not limited thereto. A second shielding rib(s) 413 (e.g., the second shielding rib 713 of FIG. 13) formed in the first area R1 may be disposed to penetrate the first circuit board (e.g., the printed circuit board 203) to contact the shielding member 335. The configuration of the second shielding rib 713 is described with reference to FIG. 13.

Figure 8:
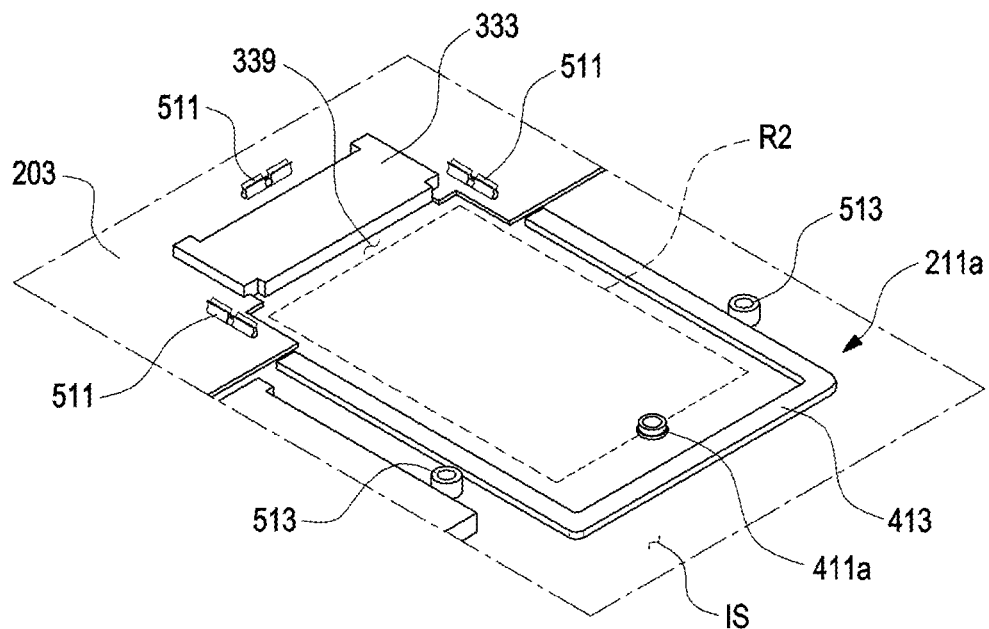
FIG. 8 is a perspective view illustrating a state in which a first circuit board is disposed in a housing of an electronic device according to various embodiments of the disclosure.

According to various embodiments, the shielding member 335 may be electrically connected with the printed circuit board 203 through a connection structure, such as soldering or a clip member (e.g., the clip member 511 of FIG. 8). The connection structure may be connected with the ground conductor of the printed circuit board 203. The shielding member 335 may be electrically connected with the ground conductor of the printed circuit board 203 through the connection structure, providing an electromagnetic shielding structure to the storage device 331 and/or the connection member 333. The connection structure, such as soldering or a clip member, may be positioned substantially in the first area R1 and may be disposed around the area where the connection member is disposed.

According to various embodiments, the electronic device 100 or 200 may include a first fastening boss 411*a* and a first screw 411*b* for fixing the storage device 331, e.g., the second circuit board 331*a*, onto the housing 201. According to an embodiment, the first fastening boss 411*a* may protrude from the inner surface IS of the housing 201 (e.g., the rear plate 211*a*). A portion of the edge of the second circuit board 331*a* may be supported by the first fastening boss 411*a*. For example, if one end of the second circuit board 331*a* is fastened to the connection member 333, the other end of the second circuit board 331*a* may be partially seated or supported on the first fastening boss 411*a*. The first screw 411*b* may be fastened to the first fastening boss 411*a*, and the other end of the second circuit board 331*a* may be substantially fixed between the first fastening boss 411*a* and the head of the first screw 411*b*. In some embodiments, the first fastening boss 411*a* may be formed to support an arbitrary point on one surface (e.g., the lower surface) of the second circuit board 331*a*, and the first screw 411*b* may substantially pass through the second circuit board 331*a* to be fastened to the first fastening boss 411*a*. In another embodiment, a plurality of first fastening bosses 411a may be formed to support the lower surface of the second circuit board 331a in different positions. For example, the number and positions of the first fastening bosses 411a may be varied considering the size and shape of the second circuit board 331a.

According to various embodiments, although not shown, when the electronic device 100 or 200 includes a supporting member integrally formed with a side surface member (e.g., the side structure 211b of FIG. 3), the supporting member may be at least partially disposed between the shielding member 335 and the display 202. For example, the supporting member may have a substantially flat plate shape and may prevent the shielding member 335 from directly contacting the display panel 223. In some embodiments, the supporting member is a component separated from the side structure 211b and may mean a metal bracket or an elastic sheet that at least partially surrounds the display panel 223.

Various embodiments of a structure in which the storage device 331 and/or the shielding member 335 are disposed inside the housing 201 are described below with reference to FIGS. 8 to 19. The following description may be made with reference to the drawings related to the foregoing embodiments or the configurations of the electronic device.

Figure 9:
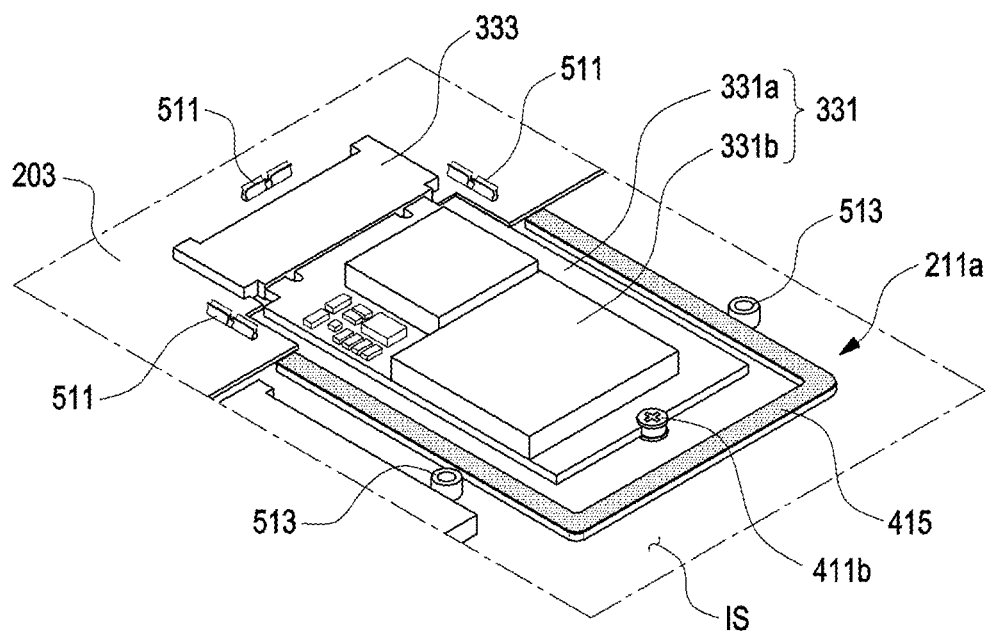
FIG. 9 is a perspective view illustrating a state in which a second circuit board is connected to a first circuit board in a housing of an electronic device according to various embodiments of the disclosure.
Figure 10:
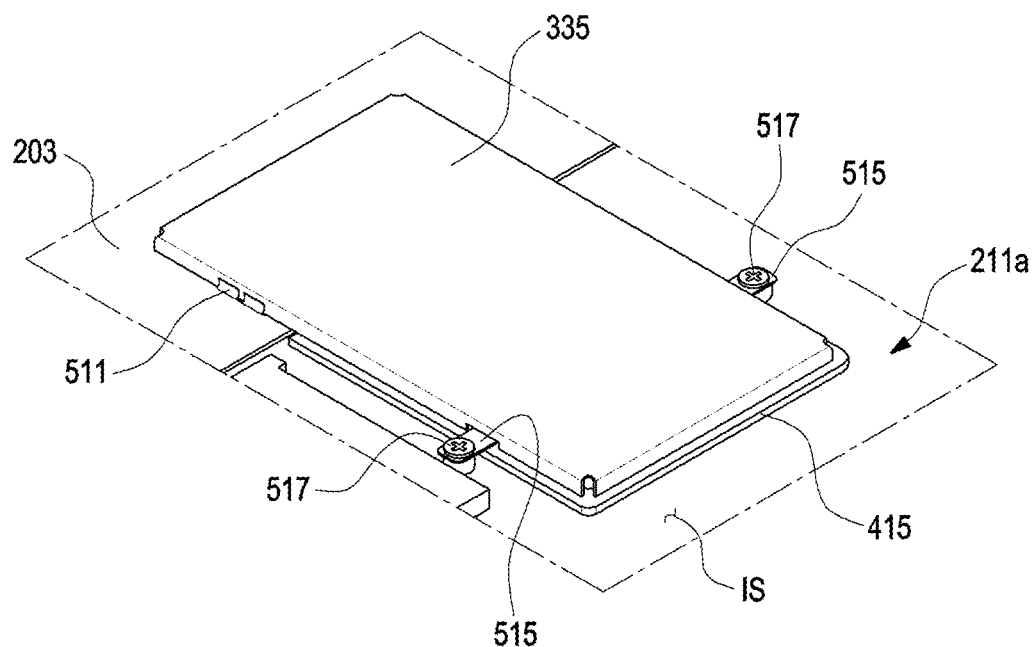
FIG. 10 is a perspective view illustrating a state in which a shielding member is disposed in a housing of an electronic device according to various embodiments of the disclosure.

FIG. 8 is a perspective view illustrating a state in which a first circuit board (e.g., the printed circuit board 203 of FIG. 3) is disposed in a housing (e.g., the housing 101 or 201 of FIGS. 1 to 3) of an electronic device (e.g., the electronic device 100 or 200 of FIGS. 1 to 3) according to various embodiments of the disclosure. FIG. 9 is a perspective view illustrating a state in which a second circuit board 331a is connected to a first circuit board (e.g., the printed circuit board 203 of FIG. 3) inside a housing 101 or 201 of an electronic device 100 or 200 according to various embodiments of the disclosure. FIG. 10 is a perspective view illustrating a state in which a shielding member 335 is disposed in a housing 101 or 201 of an electronic device 100 or 200 according to various embodiments of the disclosure.

First, referring to FIG. 8, a shielding rib 413 may be formed on an inner surface IS of the housing 201, e.g., the rear plate 211a, to surround an area (e.g., the second area R2) corresponding to the second circuit board 331a. The shielding rib 413 may be positioned adjacent to the printed circuit board 203, and the second area R2 may be defined as an area substantially surrounded by the shielding rib 413 and the printed circuit board 203. In some embodiments, at least one second fastening boss 513 may be formed on the inner surface IS of the housing 201 and/or the rear plate 211a. The second fastening boss(es) 513 may provide a means for fixing the shielding member 335 to the inner surface IS of the housing 201. If the first fastening boss 411a supporting or fixing the second circuit board 331a is positioned in the second area R2, the second fastening boss(es) 513 may be positioned outside the second area R2. According to an embodiment, the second fastening boss(es) 513 is a structure in direct contact with the shielding member 335 and may include a means for electrically connecting the electrically conductive portion of the housing 201 with the shielding member 335.

According to various embodiments, the opening area 339 defined by a portion of the first circuit board, e.g., the printed circuit board 203, may partially overlap the second area R2. In some embodiments, the connection member 333 may be partially positioned in a portion of the opening area 339 while being mounted on the printed circuit board 203. For example, in the structure illustrated in FIG. 8, a portion of the opening area 339 may be covered by a portion of the connection member 333. In some embodiments, a portion of the opening area 339 may be an area in which a portion of the second circuit board 331a is positioned as a portion of the connection member 333 is positioned.

According to various embodiments, at least one clip member 511 may be disposed on one surface of the printed circuit board 203, e.g., the upper surface and/or the second surface F2 of FIG. 7. The clip member 511 may be electrically connected with the ground conductor provided inside the printed circuit board 203 and may be disposed around the portion where the connection member 333 is disposed. According to an embodiment, the clip member 511 may be fastened to the shielding member 335 to electrically connect the shielding member 335 to the printed circuit board 203 (e.g., the ground conductor). A plurality of clip members 511 may be disposed around the connection member 333. Given that an electromagnetic shielding structure is formed, the number and positions of the clip members 511 may be appropriately selected. In some embodiments, the clip member 511 may be replaced with a conductive pad, and the shielding member 335 may be soldered to the conductive pad.

Referring to FIG. 9, the storage device 331 may be disposed in the second area R2 in a state in which the second circuit board 331a is fastened to the connection member 333. The second circuit board 331a may be partially received in the opening area 339 and may be fastened to the connection member 333 within the opening area 339. In one embodiment, a portion of the edge of the second circuit board 331a may be supported by the first fastening boss 411a. As the first screw 411b is fastened to the first fastening boss 411a, the storage device 331 and/or the second circuit board 331a may be fixed onto the inner surface IS of the housing 201 by the connection member 333 and the first fastening boss 411a (and/or the first screw 411b). According to another embodiment, a gasket 415 may be disposed on the upper end of the shielding rib 413. The gasket 415 may be formed of an elastically conductive material and may be electrically connected with the shielding rib 413 and/or the electrically conductive material portion of the housing 201.

Referring to FIG. 10, the shielding member 335 may be disposed or fixed on the housing 201 while receiving the storage device 331 and/or the connection member 333. In one embodiment, the shielding member 335 may include fastening piece(s) 515 extending from the outer surface, and the fastening piece(s) 515 may be arranged corresponding to the second fastening bosses 513. For example, as the second screw 517 is fastened through the fastening piece 515 to the second fastening boss 513, the shielding member 335 may be mounted or fixed onto the inner surface IS of the housing 201. In a state of being mounted or fixed onto the inner surface IS of the housing 201, the shielding member 335 may be fastened to the clip member(s) 511 to pressurize the gasket 415. For example, the shielding member 335 is electrically connected with the printed circuit board 203 (e.g., the ground conductor) through the clip member(s) 511 and may thus be electrically connected through the gasket 415 and/or the shielding rib 413 to the electrically conductive portion of the housing 201.

Figure 11:
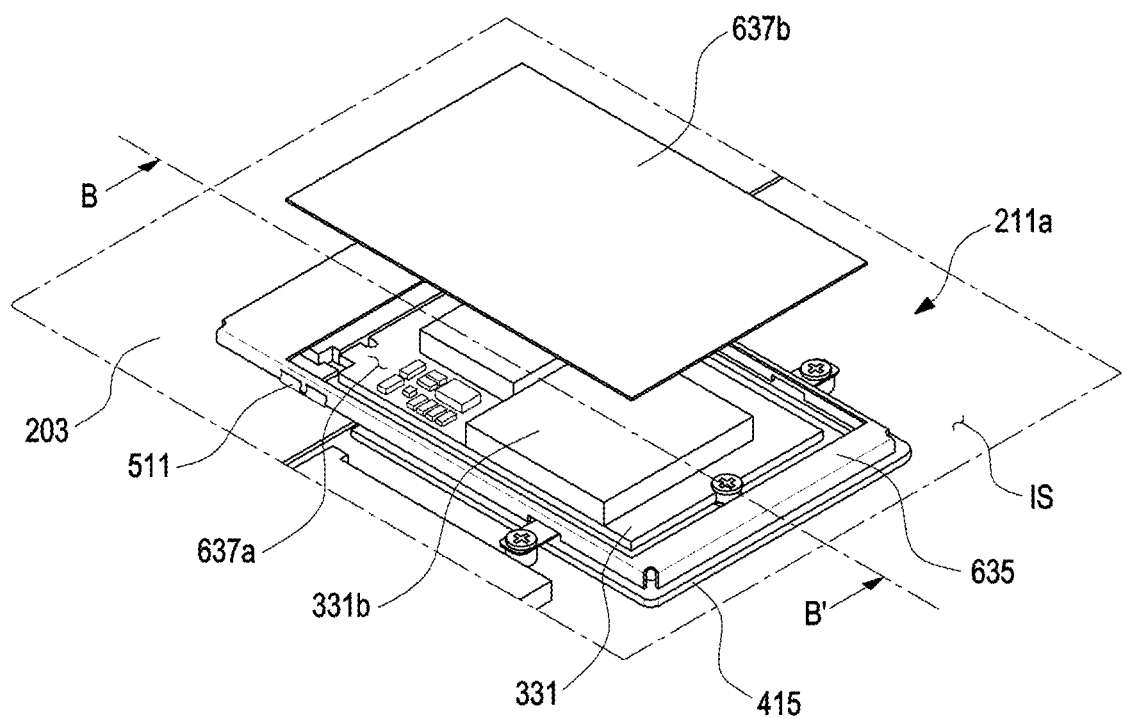
FIG. 11 is an exploded perspective view illustrating a modified example of an electronic device according to various embodiments of the disclosure.
Figure 12:
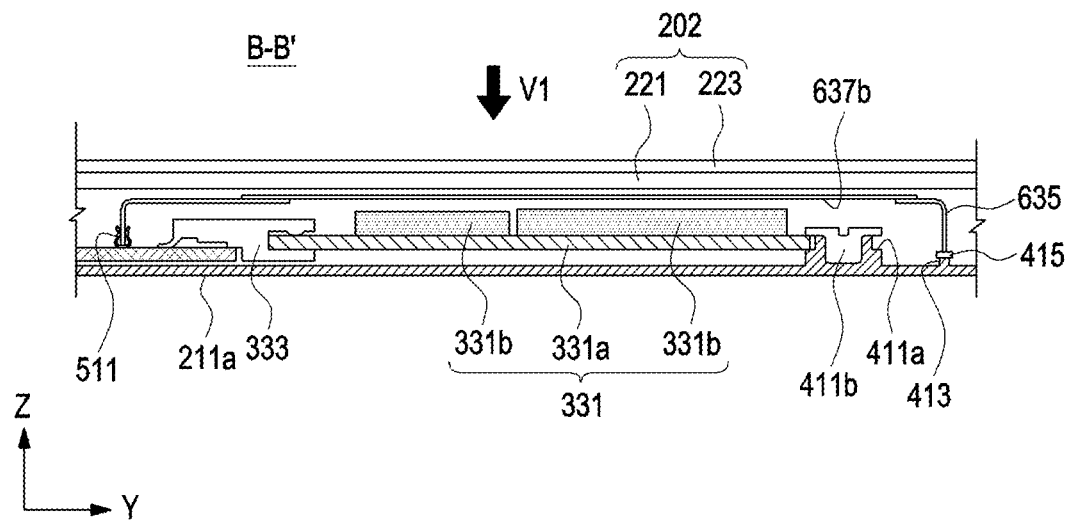
FIG. 12 is a cross-sectional view illustrating a portion of an electronic device, taken along line B-B' of FIG. 11.

FIG. 11 is an exploded perspective view illustrating a modified example of an electronic device (e.g., the electronic device 100 or 200 of FIGS. 1 to 3) according to various embodiments of the disclosure. FIG. 12 is a cross-sectional view illustrating a portion of the electronic device 100 or 200, taken along line B-B' of FIG. 11.

Referring to FIGS. 11 and 12, the electronic device 100 or 200 may further include an opening 637a formed to pass through the shielding member 635 (e.g., the shielding member 335 of FIG. 7) and a first shielding film 637b attached to the shielding member 635. The first shielding film 637b may be a film formed of an electromagnetic shielding material and/or a synthetic resin film coated with an electromagnetic shielding material and may be attached to the shielding member 635 to at least partially close the opening 637a. For example, the first shielding film 637b may be disposed to at least partially face the second circuit board 331a and/or the memory chip 331b. In some embodiments, the first shielding film 637b may be attached to the outer surface of the shielding member 635 and may completely close the opening 637a.

According to various embodiments, the memory chips 331b may be disposed to protrude from one surface (e.g., the upper surface) of the second circuit board 331a and may be at least partially received in the opening 637a. For example, the electromagnetic shielding structure including the opening 637a may reduce the height of the shielding member 635 (e.g., the height measured along the Z-axis direction from the inner surface IS of the housing 201) and, as the first shielding film 637b is disposed, the electromagnetic shielding performance may be maintained substantially equal to that of the shielding member (e.g., the shielding member 335 in FIG. 7) before forming the opening 637a.

Figure 13:
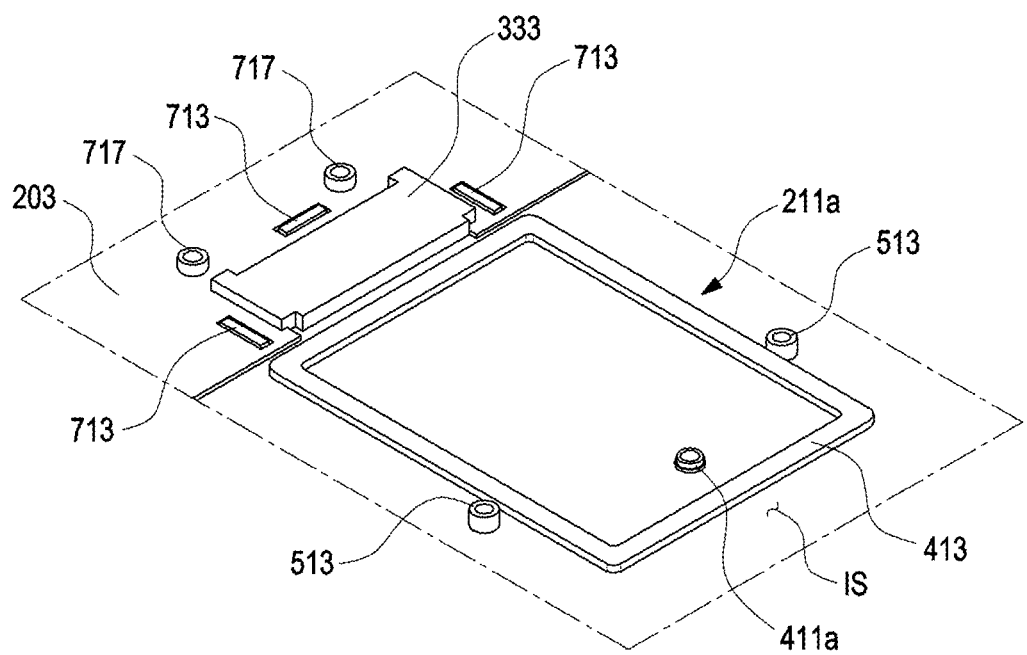
FIG. 13 is a perspective view illustrating a state in which a first circuit board is disposed in a housing in another modified example of an electronic device according to various embodiments of the disclosure.
Figure 14:
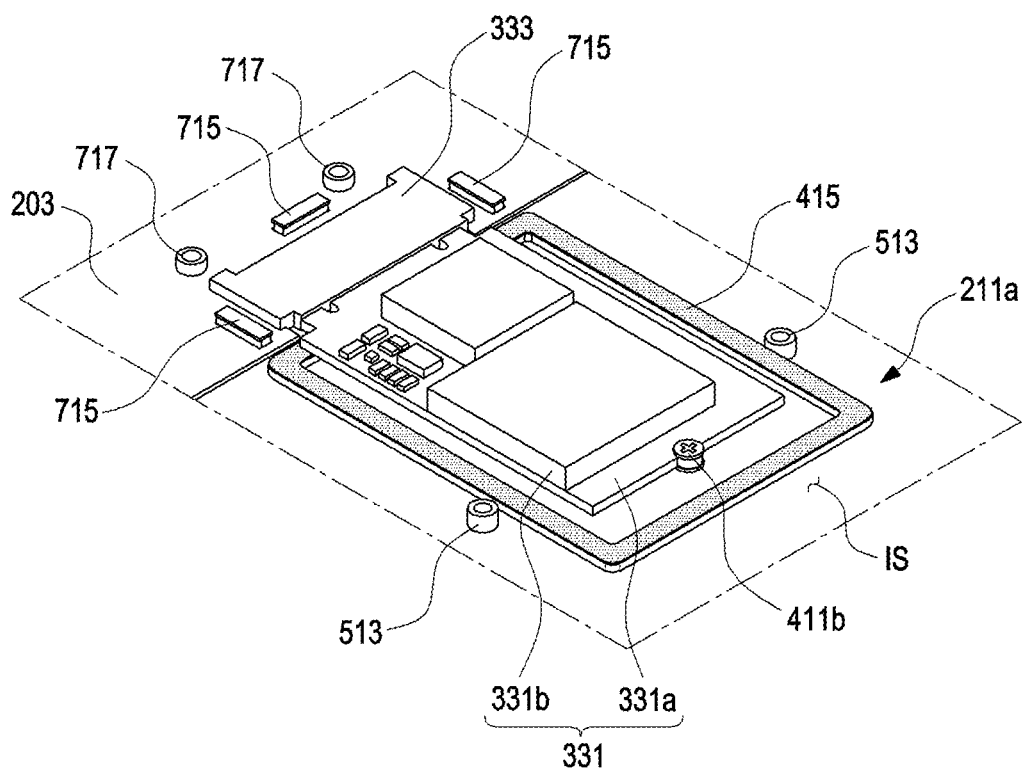
FIG. 14 is a perspective view illustrating a state in which a second circuit board is connected to a first circuit board in another modified example of an electronic device according to various embodiments of the disclosure.
Figure 15:
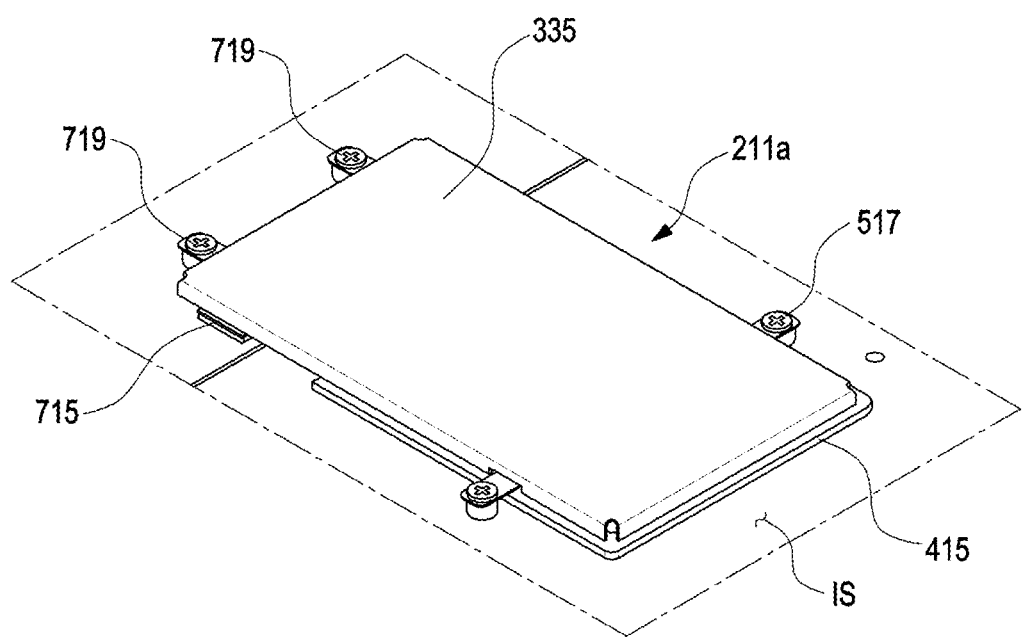
FIG. 15 is a perspective view illustrating a state in which a shielding member is disposed in another modified example of an electronic device according to various embodiments of the disclosure.

FIG. 13 is a perspective view illustrating a state in which a first circuit board (e.g., the printed circuit board 203 of FIG. 3) is disposed in a housing (e.g., the housing 101 or 201 of FIGS. 1 to 3) in another modified example of an electronic device (e.g., the electronic device 100 or 200 of FIGS. 1 to 3) according to various embodiments of the disclosure. FIG. 14 is a perspective view illustrating a state in which a second circuit board 331a is connected to a first circuit board (e.g., the printed circuit board 203) in another modified example of an electronic device 100 or 200 according to various embodiments of the disclosure. FIG. 15 is a perspective view illustrating a state in which a shielding member 335 is disposed in another modified example of an electronic device 100 or 200 according to various embodiments of the disclosure.

Referring to FIG. 13, a shielding rib 413 may be formed on an inner surface IS of the housing 201, e.g., the rear plate 211a, to surround an area (e.g., the second area R2) corresponding to the second circuit board 331a. The shielding rib 413 may be positioned adjacent to the printed circuit board 203, and the second area R2 may be defined as an area substantially surrounded by the shielding rib 413 and the printed circuit board 203. In some embodiments, at least one second fastening boss 513 may be formed on the inner surface IS of the housing 201. The second fastening boss(es) 513 may provide a means for fixing the shielding member 335 to the inner surface IS of the housing 201. If the first fastening boss 411a supporting or fixing the second circuit board 331a is positioned in the second area R2, the second fastening boss(es) 513 may be positioned outside the second area R2. According to an embodiment, the second fastening boss(es) 513 is a structure in direct contact with the shielding member 335 and may include a means for electrically connecting the electrically conductive portion of the housing 201 with the shielding member 335.

According to various embodiments, the electronic device 100 or 200 may include an opening area (e.g., the opening area 339 of FIG. 5) defined by a portion of the first circuit board, e.g., the printed circuit board 203. It should be noted that in the present embodiment, the opening area is substantially hidden by a portion of the connection member 333 and is not shown in the drawings. For example, the connection member 333 may be partially disposed in the opening area while being mounted on one surface of the printed circuit board 203. In the illustrated embodiment, as a portion of the connection member 333 is disposed substantially over the entire opening area, the second area R2 may not overlap the opening area.

According to various embodiments, the electronic device 100 or 200 may further include at least one second shielding rib 713 protruding from the inner surface IS of the housing 201 (e.g., the rear plate 211a). The second shielding rib(s) 713 may be formed in an area corresponding to the printed circuit board 203 and protrude from the inner surface IS of the housing 201 around the area corresponding to the connection member 333. If the printed circuit board 203 is disposed to face the inner surface IS of the housing 201, the second shielding rib(s) 713 may be disposed to penetrate the printed circuit board 203. For example, the second shielding rib(s) 713 may be disposed to penetrate the printed circuit board 203 around the area where the connection member 333 is mounted. As described in connection with FIG. 14, the electronic device 100 or 200 may further include second gasket(s) 715 disposed at an end of the second shielding rib(s) 713. The second gasket 715 may have electrical conductivity and may be electrically connected with the electrically conductive portion of the housing 201 through the second shielding rib(s) 713.

According to various embodiments, in the embodiment in which the second shielding rib(s) 713 is disposed to penetrate the printed circuit board 203, the electronic device 100 or 200 may include at least one third fastening boss 717. The third fastening boss(es) 717 may protrude from the inner surface IS of the housing 201 and be disposed to penetrate the printed circuit board 203. According to an embodiment, in a structure in which a clip member (e.g., the clip member 511 of FIGS. 8 and/or 9) is disposed on the printed circuit board 203 to engage with the shielding member 335, the clip member 511 itself may be utilized as a mechanical means for fixing or supporting the shielding member 335. In the arrangement structure of the electronic device 100 or 200 and/or the shielding member 335 according to the present embodiment, the second shielding rib(s) 713 (and/or the second gasket 715) replacing the clip member 511 of the prior embodiment may provide an electrical connection structure while providing a mechanical means in which the third fastening boss(es) 717 fixes or supports the shielding member 335. In the structure in which the third fastening boss(es) 717 is disposed inside the electronic device 100 or 200, the shielding member 335 may include additional fastening piece(s) corresponding to the third fastening boss(es) 717.

Referring to FIG. 14, the storage device 331 may be disposed in the second area R2 in a state in which the second circuit board 331a is fastened to the connection member 333. In one embodiment, a portion of the edge of the second circuit board 331a may be supported by the first fastening boss 411a. As the first screw 411b is fastened to the first fastening boss 411a, the second circuit board 331a may be fixed onto the inner surface IS of the housing 201 by the connection member 333 and the first fastening boss 411a (and/or the first screw 411b). According to another embodiment, a gasket(s) 415 and 715 may be disposed on the upper end of the shielding rib 413 and/or the second shielding rib 713. The gasket(s) 415 and 715 may be formed of an elastically conductive material and may be electrically connected with the shielding rib 413 or 713 and/or the electrically conductive material portion of the housing 201.

Referring to FIG. 15, the shielding member 335 may be disposed or fixed on the housing 201 while receiving the storage device 331 and/or the connection member 333. In one embodiment, the shielding member 335 may include a fastening piece(s) (e.g., the fastening piece 515 of FIG. 10) extending from the outer surface. The fastening piece(s) 515 may be disposed corresponding to the second fastening bosses (e.g., the second fastening bosses 513 of FIGS. 13 and/or 14) and/or the third fastening bosses 717. For example, as the second screw 517 and/or the third screw 719 is fastened through the fastening piece 515 to the second fastening bosses 513 and third fastening boss 717, the shielding member 335 may be mounted or fixed onto the inner surface IS of the housing 201. In a state of being mounted or fixed onto the inner surface IS of the housing 201, the shielding member 335 may pressurize the gaskets 415 and 715. For example, the shielding member 335 may be electrically connected with the electrically conductive portion of the housing 201 through the gaskets 415 and 715 and/or the shielding ribs 413 and 713. In one embodiment, in the structure provided with the second shielding rib(s) 713, the shielding member 335 may not be electrically connected with the printed circuit board 203. However, various embodiments of the disclosure are not limited thereto, and some of the second shielding ribs 713 of FIG. 13 may be replaced with the clip member 511 of FIG. 8 to electrically connect the shielding member 335 and the printed circuit board 203.

Figure 16:
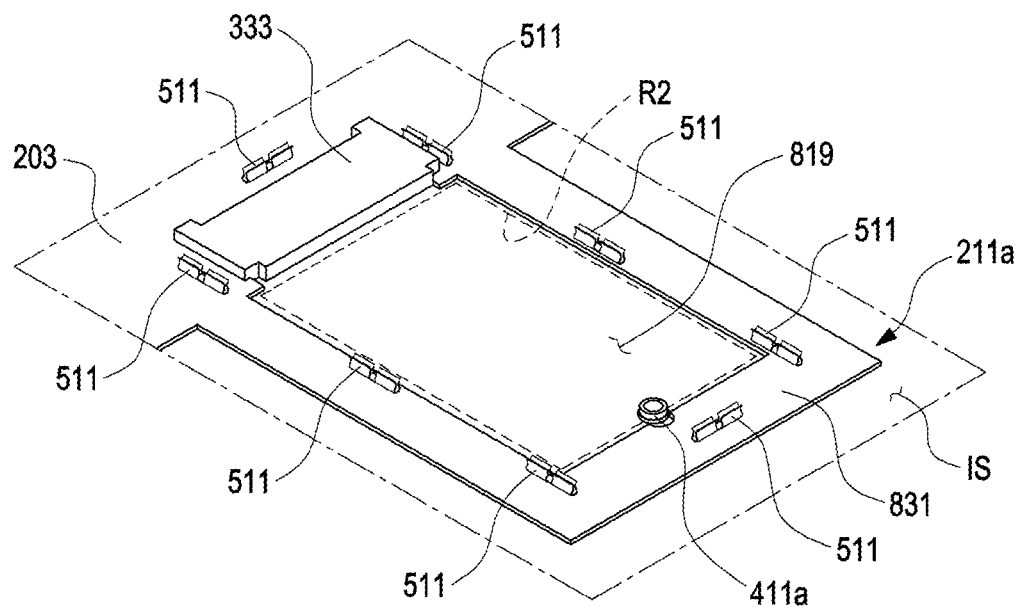
FIG. 16 is a perspective view illustrating a state in which a first circuit board is disposed in a housing in still another modified example of an electronic device according to various embodiments of the disclosure.
Figure 17:
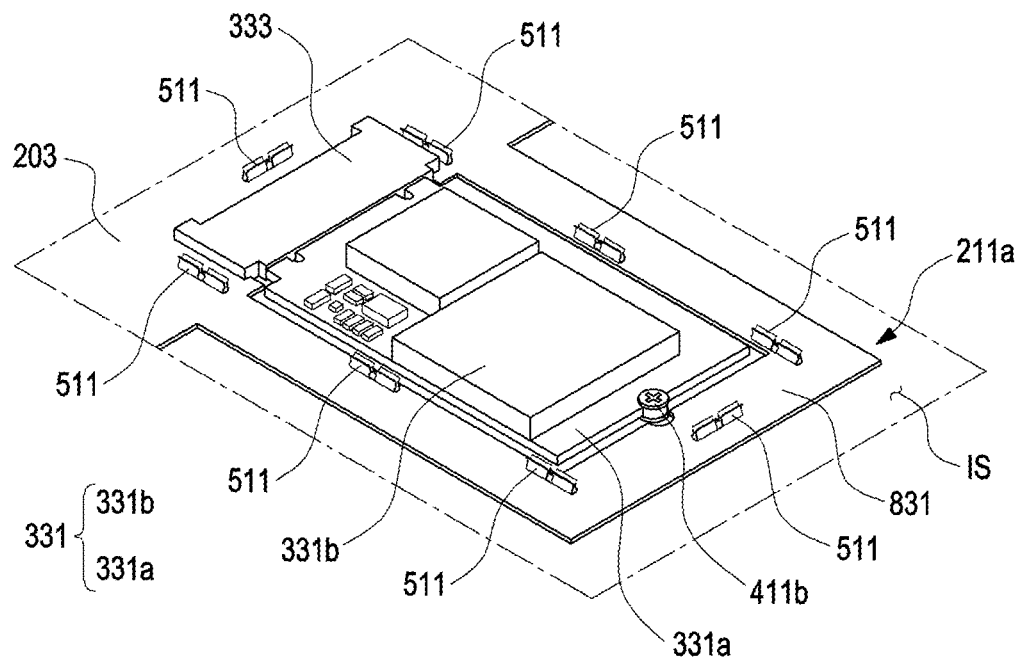
FIG. 17 is a perspective view illustrating a state in which a second circuit board is connected to a first circuit board in still another modified example of an electronic device according to various embodiments of the disclosure.
Figure 18:
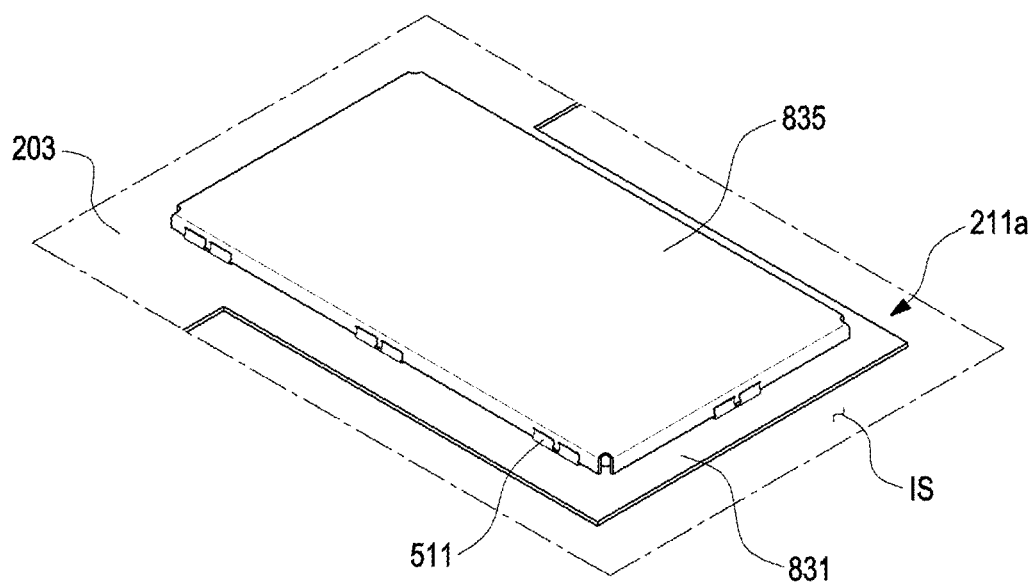
FIG. 18 is a perspective view illustrating a state in which a shielding member is disposed in still another modified example of an electronic device according to various embodiments of the disclosure.
Figure 19:
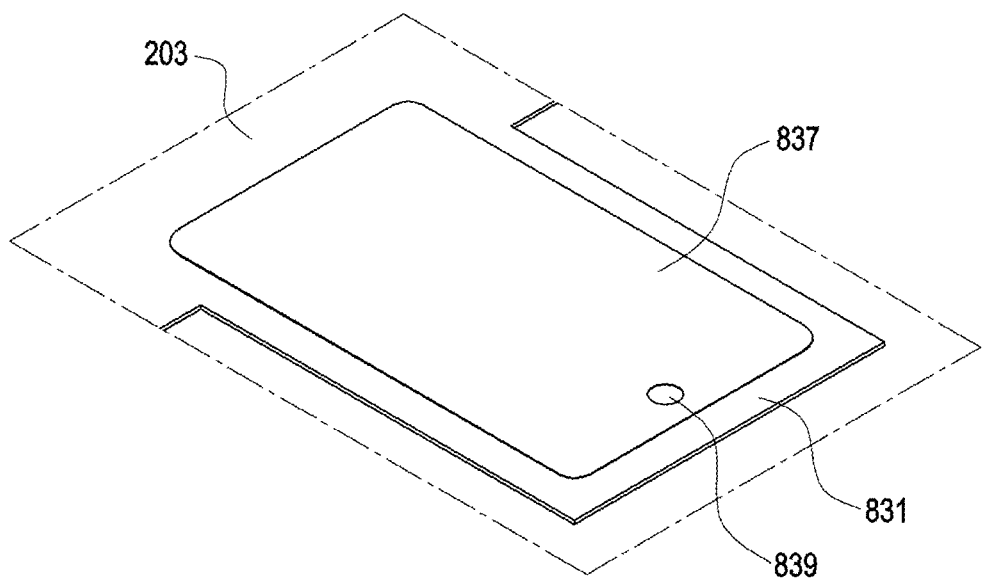
FIG. 19 is a perspective view illustrating one surface of a first circuit board in still another modified example of an electronic device according to various embodiments of the disclosure.

FIG. 16 is a perspective view illustrating a state in which a first circuit board (e.g., the printed circuit board 203 of FIG. 3) is disposed in a housing (e.g., the housing 101 or 201 of FIGS. 1 to 3) in still another modified example of an electronic device (e.g., the electronic device 100 or 200 of FIGS. 1 to 3) according to various embodiments of the disclosure. FIG. 17 is a perspective view illustrating a state in which a second circuit board 331a is connected to a first circuit board (e.g., the printed circuit board 203) in still another modified example of an electronic device 100 or 200 according to various embodiments of the disclosure. FIG. 18 is a perspective view illustrating a state in which a shielding member 835 is disposed in still another modified example of an electronic device 100 or 200 according to various embodiments of the disclosure. FIG. 19 is a perspective view illustrating one surface of a first circuit board (e.g., the printed circuit board 203) in still another modified example of an electronic device 100 or 200 according to various embodiments of the disclosure.

Referring to FIG. 16, the opening area 819 of the electronic device 100 or 200 may be defined by a portion of the printed circuit board 203, and the printed circuit board 203 may include a closed loop-shaped portion 831 surrounding the opening area 819. For example, the printed circuit board 203 may include an area in which a portion of the edge thereof protrudes beyond the other portion, and the opening area 819 may be implemented in the form of a hole passing through the protruding area of the printed circuit board 203. In some embodiments, when viewed in plan view, e.g., when viewed in a direction V1 of FIG. 7, the closed loop-shaped portion 831 may have a frame shape to surround the opening area 819. The opening area 819 may be provided corresponding to the second area R2 and may provide an area in which a portion of the connection member 333 is disposed. In one embodiment, the first fastening boss 411a supporting the second circuit board 331a may be disposed substantially on the opening area 819.

According to various embodiments, the electronic device 100 or 200 may include a plurality of clip members 511 disposed on one surface (e.g., the upper surface and/or the second surface F2 of FIG. 7) of the printed circuit board 203. The clip members 511 may be disposed around the area where the connection member 333 is mounted and on the closed loop-shaped portion 831 and may provide a means to electrically connect the shielding member 835 to the ground conductor of the printed circuit board 203. In some embodiments, the clip member 511 may provide a mechanical fixing structure that is fastened to the shielding member 835 in the form of pressurizing the inner and outer surfaces of the shielding member 835. For example, the clip member 511 may provide an electrical connection structure and a mechanical fixing structure.

According to various embodiments, some of the clip members 511 may be replaced with the second shielding rib 713 and/or the second gasket 715 of FIGS. 13 and 14 and, in this case, the electronic device 100 or 200 may further include a fastening boss (e.g., at least one of the fastening bosses 513 and 717 of FIG. 13) for fixing the shielding member 835. In another embodiment, the electronic device 100 or 200 may further include a shielding rib (e.g., the shielding rib 413 of FIG. 8) formed around the closed loop-shaped portion 831. The shielding member 835 may be electrically connected with the housing 201 through the shielding rib (e.g., the second shielding rib 713 of FIG. 13) replacing the clip member 511 and/or the shielding rib (e.g., the shielding rib 413 of FIG. 8) formed around the closed loop-shaped portion 831.

Referring to FIG. 17, the storage device 331 may be disposed on the opening area 819 in a state in which the second circuit board 331a is fastened to the connection member 333 and may be fastened to the connection member within the opening area 819. In one embodiment, a portion of the edge of the second circuit board 331a may be supported by the first fastening boss 411a. As the first screw 411b is fastened to the first fastening boss 411a, the second circuit board 331a may be fixed onto the inner surface IS of the housing 201 by the connection member 333 and the first fastening boss 411a (and/or the first screw 411b).

Referring to FIG. 18, the shielding member 835 may be disposed or fixed on the printed circuit board 203 and/or the housing 201 while receiving the storage device 331 and/or the connection member 333. In one embodiment, the shielding member 835 may be substantially engaged with the clip members 511 and mount or fixed to one surface (e.g., the upper surface and/or second surface F2 of FIG. 7) of the printed circuit board 203. For example, the shielding member 835 may be fixed to one surface of the printed circuit board 203 while electrically connected with the printed circuit board 203 (e.g., the ground conductor) through the clip members 511. In some embodiments, when some of the clip members 511 are replaced with the second shielding rib 713 and/or the second gasket 715 of FIGS. 13 and 14, the shielding member 835 may pressurize the second gasket 715 on one surface of the printed circuit board 203. For example, the shielding member 835 may be electrically connected with the housing 201 through the second gasket 715 and/or the second shielding rib 713 replacing the clip member(s) 511.

Referring to FIG. 19, in a structure in which the opening area 819 is surrounded by the closed loop-shaped portion 831, the electronic device 100 or 200 may further include a second shielding film 837. The second shielding film 837 may be attached to, e.g., the other surface (e.g., the lower surface and/or the first surface F1 of FIG. 7) of the printed circuit board 203, closing the opening area 819. The second shielding film 837 may be electrically connected with the ground conductor provided inside the printed circuit board 203 and may, in combination with the shielding member 835, provide an electromagnetic shielding environment to the storage device 331 and/or the connection member 333. According to an embodiment, the second shielding film 837 may be formed to close the opening area 819 and may include a through hole 839 corresponding to the first fastening boss 411a. For example, the first screw (e.g., the first screw 411b of FIG. 17) for supporting or fixing the second circuit board 331a onto the housing 201 may penetrate the second shielding film 837 through the through hole 839 and may be fastened to the first fastening boss 411a. In one embodiment, in the structure in which the shielding rib (e.g., the shielding rib 413 or 713 of FIG. 13) formed around the closed loop-shaped portion 831 and/or replacing some of the clip members 511 may be provided and the shielding member 835 is electrically connected with the housing 201, the second shielding film 837 may be omitted.

According to various embodiments of the disclosure, an electronic device (e.g., the electronic device 100 or 200 of FIGS. 1 to 3) may comprise a housing (e.g., the housing 101 or 201 of FIGS. 1 to 3) at least partially including an electrically conductive material, a first circuit board (e.g., the printed circuit board 203 of FIGS. 3 to 7) received in the housing, a connection member (e.g., the connection member 333 of FIG. 5 and/or FIG. 7) disposed on the first circuit board and partially protruding from an edge of the first circuit board, a second circuit board (e.g., the second circuit board 331a of FIG. 5 and/or FIG. 7) received in the housing and connected to the connection member from one side of the first circuit board, and a shielding member (e.g., the shielding member 335 of FIG. 6 and/or FIG. 7) disposed to receive the connection member and the second circuit board inside the housing. The shielding member may be electrically connected to at least one of the housing and the first circuit board.

According to various embodiments, when viewed from a front surface of the housing, a portion of the connection member may be disposed to overlap the first circuit board, and another portion of the connection member may be disposed between the first circuit board and the second circuit board.

According to various embodiments, the electronic device may further comprise a window plate (e.g., the first plate 102 of FIG. 1 and/or the window plate 221 of FIG. 3) disposed on the front surface of the housing.

According to various embodiments, the electronic device may further comprise a shielding rib (e.g., the shielding rib 413 of FIG. 7 and/or FIG. 8) protruding from an inner surface of the housing, and a gasket (e.g., the gasket 415 of FIG. 7 and/or FIG. 9) disposed on the shielding rib and having electrical conductivity. The shielding member may be disposed in contact with the gasket to be electrically connected with the housing.

According to various embodiments, the shielding rib may include a first shielding rib (e.g., the shielding rib 413 of FIG. 7 and/or FIG. 13) formed, around an area corresponding to the second circuit board, on the inner surface of the housing, and a second shielding rib (e.g., the second shielding rib 713 of FIG. 13) formed, around an area corresponding to the connection member, on the inner surface of the housing.

According to various embodiments, a plurality of second shielding ribs may be disposed to pass through the first circuit board.

According to various embodiments, the electronic device may further comprise a shielding rib (e.g., the shielding rib 413 of FIG. 8) formed, around an area corresponding to the second circuit board, on the inner surface of the housing, a gasket (e.g., the gasket 415 of FIG. 9) disposed on the shielding rib and having electrical conductivity, and a clip member (e.g., the clip member 511 of FIG. 8) disposed on the first circuit board. The shielding member may be disposed in contact with the gasket to be electrically connected with the housing and disposed to be engaged with the clip member to be electrically connected with the first circuit board.

According to various embodiments, the electronic device may further comprise at least one fastening boss (e.g., the fastening bosses 513 and 717 of FIG. 8 and/or FIG. 13) protruding from the housing and at least one fastening piece (e.g., the fastening piece 515 of FIG. 9) formed on the shielding member. The fastening piece may be fastened to the fastening boss to electrically connect the shielding member to the housing.

According to various embodiments, the electronic device may further comprise an opening area (e.g., the opening area 339 or 819 of FIG. 5 and/or FIG. 16) provided on one side of the first circuit board and at least partially defined by a portion of the first circuit board. At least a portion of the second circuit board may be disposed in the opening area.

According to various embodiments, when viewed from a front surface of the housing, the connection member may be partially disposed in the opening area.

According to various embodiments, the electronic device may further comprise a shielding film (e.g., the second shielding film 837 of FIG. 19) attached to any one surface of the first circuit board to at least partially close the opening area. The first circuit board may include a closed loop-shaped portion (e.g., the closed loop-shaped portion 831 of FIG. 16) defining the opening area.

According to various embodiments, the first circuit board may include a first surface (e.g., the first surface F1 of FIG. 7) facing an inner surface of the housing and a second surface (e.g., the second surface F2 of FIG. 7) facing away from the first surface. The second circuit board may be disposed at a designated distance (e.g., the designated distance G3 of FIG. 7) from the inner surface of the housing. The designated distance may be larger than a gap (e.g., the gap denoted by G1' of FIG. 7) between the inner surface of the housing and the first surface and smaller than a gap (e.g., the gap denoted by 'G2' of FIG. 7) between the inner surface of the housing and the second surface.

According to various embodiments, the electronic device may further comprise an opening (e.g., the opening 637a of FIG. 11) formed to pass through the shielding member, and a shielding film (e.g., the first shielding film 637b of FIG. 11) attached to the shielding member to at least partially close the opening. The shielding film may be disposed to at least partially face the second circuit board.

According to various embodiments of the disclosure, an electronic device (e.g., the electronic device 100 or 200 of FIGS. 1 to 3) may comprise a housing (e.g., the housing 101 or 201 of FIGS. 1 to 3) at least partially including an electrically conductive material, a first circuit board (e.g., the printed circuit board 203 of FIGS. 3 to 7) received in the housing, a connector (e.g., the connection member 333 of FIG. 5 and/or FIG. 7 or an on-board connector) mounted on the first circuit board and partially protruding from an edge of the first circuit board, a second circuit board (e.g., the second circuit board 331a of FIG. 5 and/or FIG. 7) including at least one memory chip (e.g., the memory chip 331b of FIG. 7) disposed on at least one surface and connected to the first circuit board through the connector from one side of the first circuit board, and a shield can (e.g., the shielding member 335 of FIG. 6 and/or FIG. 7) disposed to receive the connector and the second circuit board and electrically connected to at least one of the housing and the first circuit board to form an electromagnetic shielding structure. When viewed from a front surface of the housing, the second circuit board may be disposed on one side of the first circuit board.

According to various embodiments, when viewed from a front surface of the housing, a portion of the connector may be disposed to overlap the first circuit board, and another portion of the connector may be disposed between the first circuit board and the second circuit board.

According to various embodiments, the first circuit board may include a first surface (e.g., the first surface F1 of FIG. 7) facing an inner surface of the housing and a second surface (e.g., the second surface F2 of FIG. 7) facing away from the first surface. The second circuit board may be disposed at a designated distance (e.g., the designated distance G3 of FIG. 7) from the inner surface of the housing. The designated distance may be larger than a gap (e.g., the gap denoted by G1' of FIG. 7) between the inner surface of the housing and the first surface and smaller than a gap (e.g., the gap denoted by 'G2' of FIG. 7) between the inner surface of the housing and the second surface.

According to various embodiments, the electronic device may further comprise a shielding rib (e.g., the shielding rib 413 of FIG. 7 and/or FIG. 8) formed around an area corresponding to the second circuit board on an inner surface of the housing and a gasket (e.g., the gasket 415 of FIG. 7 and/or FIG. 9) disposed on the shielding rib and having electrical conductivity. The shield may be disposed in contact with the gasket to be electrically connected with the housing.

According to various embodiments, the electronic device may further comprise at least one shielding rib (e.g., the second shielding rib 713 of FIG. 13) protruding from an inner surface of the housing and disposed to pass through the first circuit board and a gasket (e.g., the second gasket 715 of FIG. 14) disposed on the shielding rib and having electrical conductivity. The shield may be disposed in contact with the gasket to be electrically connected with the housing.

According to various embodiments, the electronic device may further comprise an opening area (e.g., the opening area 339 or 819 of FIG. 5 and/or FIG. 16) provided on one side of the first circuit board and at least partially defined by a portion of the first circuit board. At least a portion of the second circuit board may be disposed in the opening area.

According to various embodiments, the electronic device may further comprise a shielding film (e.g., the second shielding film 837 of FIG. 19) attached to any one surface of the first circuit board to at least partially close the opening area. A portion of the shield may be disposed on another surface of the first circuit board.

While the disclosure has been shown and described with reference to exemplary embodiments thereof, it will be apparent to those of ordinary skill in the art that various changes in form and detail may be made thereto without departing from the spirit and scope of the disclosure as defined by the following claims. For example, various embodiments described above are not limited thereto but may be selectively combined with configurations of other embodiments, implementing still other embodiments. For example, the clip member of FIG. 8 and the second shielding rib structure of FIG. 13 may be replaced with each other, and the first shielding film and/or shielding member of FIG. 11 may replace the shielding member of another embodiment.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
    a housing at least partially including an electrically conductive material;
    a gasket disposed on an inner surface of the housing and having electrical conductivity;
    a first circuit board disposed in the housing;
    a connection member disposed on the first circuit board and partially extending past an edge of the first circuit board;
    a second circuit board disposed in the housing and connected to the connection member from a side of the first circuit board in which the connection member extends; and
    a shielding member disposed to surround the connection member and the second circuit board inside the housing,
    wherein the shielding member is disposed in contact with the gasket and electrically connected to the housing.

2. The electronic device of claim 1, wherein the connection member extends past the edge of the first circuit board when viewed from a front surface of the housing.

3. The electronic device of claim 2, further comprising a window plate disposed on the front surface of the housing.

4. The electronic device of claim 1, further comprising:
    a shielding rib protruding from an inner surface of the housing,
    wherein the gasket is disposed on the shielding rib and having electrical conductivity.

5. The electronic device of claim 4, wherein the shielding rib includes:
    a first shielding rib formed on the inner surface of the housing around an area corresponding to the second circuit board; and
    a second shielding rib formed on the inner surface of the housing around an area corresponding to the connection member.

6. The electronic device of claim 5, wherein a plurality of second shielding ribs is disposed to pass through the first circuit board.

7. The electronic device of claim 1, further comprising:
    a shielding rib formed, around an area corresponding to the second circuit board, on an inner surface of the housing; and
    a clip member disposed on the first circuit board,
    wherein the gasket is disposed on the shielding rib and having electrical conductivity, and
    wherein the shielding member is:
        disposed in contact with the gasket to electrically connect with the housing and
        disposed to be engaged with the clip member to electrically connect with the first circuit board.

8. The electronic device of claim 1, further comprising:
    at least one fastening boss protruding from the housing; and
    at least one fastening piece formed on the shielding member, wherein the fastening piece is fastened to the fastening boss to electrically connect the shielding member to the housing.

9. The electronic device of claim 1, further comprising an opening area provided on one side of the first circuit board and at least partially defined by a portion of the first circuit board,
wherein at least a portion of the second circuit board is disposed in the opening area.

10. The electronic device of claim 9, wherein, when viewed from a front surface of the housing, the connection member is partially disposed in the opening area.

11. The electronic device of claim 9, further comprising a shielding film attached to a surface of the first circuit board to at least partially close the opening area,
wherein the first circuit board includes a closed loop-shaped portion defining the opening area.

12. The electronic device of claim 1, wherein:
the first circuit board includes a first surface facing an inner surface of the housing and a second surface facing away from the first surface,
the second circuit board is disposed at a designated distance from the inner surface of the housing, and
the designated distance is larger than a gap between the inner surface of the housing and the first surface and smaller than a gap between the inner surface of the housing and the second surface.

13. The electronic device of claim 1, further comprising:
an opening formed to pass through the shielding member; and
a shielding film attached to the shielding member to at least partially close the opening,
wherein the shielding film is disposed to at least partially face the second circuit board.

14. The electronic device of claim 1, wherein:
the second circuit board includes at least one memory chip disposed on at least one surface,
the shielding member includes a shield can electrically connected to at least one of the housing and the first circuit board to form an electromagnetic shielding structure, and
when viewed from a front surface of the housing, the second circuit board is disposed on a side of the first circuit board.

15. The electronic device of claim 14, further comprising:
an opening area provided on one side of the first circuit board and at least partially defined by a portion of the first circuit board; and
a shielding film attached to a surface of the first circuit board to at least partially close the opening area,
wherein at least a portion of the second circuit board is disposed in the opening area, and a portion of the shield can is disposed on another surface of the first circuit board.

16. An electronic component assembly disposed in a housing of an electronic device, the electronic component assembly comprising:
a gasket disposed on an inner surface of the housing and having electrical conductivity;
a first circuit board;
a connection member disposed on the first circuit board and partially extending past an edge of the first circuit board;
a second circuit board connected to the connection member from a side of the first circuit board in which the connection member extends; and
a shielding member disposed to surround the connection member and the second circuit board,
wherein the shielding member is disposed in contact with the gasket and electrically connected to the housing.

17. The electronic component assembly of claim 16, further comprising an opening area provided on one side of the first circuit board and at least partially defined by a portion of the first circuit board,
wherein at least a portion of the second circuit board is disposed in the opening area.

18. The electronic component assembly of claim 17, further comprising a shielding film attached to a surface of the first circuit board to at least partially close the opening area,
wherein the first circuit board includes a closed loop-shaped portion defining the opening area.

19. The electronic component assembly of claim 16, further comprising:
an opening formed to pass through the shielding member; and
a shielding film attached to the shielding member to at least partially close the opening,
wherein the shielding film is disposed to at least partially face the second circuit board.

20. The electronic component assembly of claim 16, wherein:
the second circuit board includes at least one memory chip disposed on at least one surface, and
the shielding member includes a shield can electrically connected to at least one of the housing and the first circuit board to form an electromagnetic shielding structure.

* * * * *